(12) United States Patent
Matsuyama et al.

(10) Patent No.: US 6,585,430 B2
(45) Date of Patent: Jul. 1, 2003

(54) SYSTEM AND METHOD FOR COATING AND DEVELOPING

(75) Inventors: Yuji Matsuyama, Kumamoto (JP); Junichi Kitano, Yamanashi (JP); Takahiro Kitano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/850,032

(22) Filed: May 8, 2001

(65) Prior Publication Data

US 2002/0001679 A1 Jan. 3, 2002

(30) Foreign Application Priority Data

May 9, 2000 (JP) ........................... 2000-135988
May 9, 2000 (JP) ........................... 2000-135993

(51) Int. Cl.$^7$ ............................. G03D 5/00; G03D 27/52
(52) U.S. Cl. ............................. 396/611; 355/27; 118/52
(58) Field of Search .................... 396/611; 118/52, 118/72, 666; 355/27, 30

(56) References Cited

U.S. PATENT DOCUMENTS

| | | | | |
|---|---|---|---|---|
| 6,133,981 A | * | 10/2000 | Semba | 355/27 |
| 6,215,545 B1 | * | 4/2001 | Matsuyama | 355/30 |
| 6,261,007 B1 | * | 7/2001 | Takamori et al. | 396/611 |
| 6,287,025 B1 | * | 9/2001 | Matsuyama | 396/611 |
| 6,467,976 B2 | * | 10/2002 | Matsuyama et al. | 396/311 |

FOREIGN PATENT DOCUMENTS

| | | |
|---|---|---|
| EP | 0 829 767 | 3/1998 |
| EP | 0 879 997 | 11/1998 |
| JP | 2000-106341 | 4/2000 |
| JP | 2000-182932 | 6/2000 |
| TW | 430877 | 4/2001 |

* cited by examiner

Primary Examiner—Alan A. Mathews
(74) Attorney, Agent, or Firm—Oblon, Spivak, McClelland, Maier & Neustadt, P.C.

(57) ABSTRACT

The present invention is a system for performing coating and developing treatment for a substrate, which comprises a treatment section having a coating treatment unit for forming a coating film on the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit. The system of the present invention further comprises an interface section having a second carrier unit for carrying the substrate through a route at least between the treatment section and an exposure processing unit provided outside the system for performing exposure processing for the substrate. The system of the present invention still further comprises a pressure reducing and removing unit for removing impurities adhering to the coating film on the substrate by suction in a chamber before the substrate is subjected to the exposure processing.

According to the present invention, before exposure processing, impurities at molecular level such as oxygen, ozone, and organic substances and impurities such as particulates which adhere to the coating film of the substrate can be removed, whereby exposure processing is suitably performed, resulting in a rise in yield.

17 Claims, 19 Drawing Sheets

SYSTEM AND METHOD FOR COATING AND DEVELOPING

BACKGROUND OF THE INVENTION

1. Field of the Invention

The present invention relates to a coating and developing treatment system and a coating and developing treatment method for a substrate.

2. Description of the Related Art

In photolithography of the process of fabricating a semiconductor device, for example, resist coating treatment for forming a resist film on the surface of a wafer, developing treatment for developing the wafer after pattern exposure, heat treatment and cooling treatment performed before the coating treatment, before and after exposure processing, and after the developing treatment, and the like are performed. Such treatment and processing are performed in treatment units provided individually, and these treatment units are unified as a coating and developing treatment system so as to continuously perform the aforesaid successive treatment and processing. The exposure processing of a pattern is usually performed in an exposure processing unit(aligner) disposed adjacent to the coating and developing treatment system.

Generally, the coating and developing treatment system is composed of a loader and unloader section for carrying the wafer in/out of the coating and developing treatment system, a treatment section having a coating treatment unit, a developing treatment unit, a thermal treatment unit, and the like and performing the majority of the aforesaid treatment of the wafer, and an interface section for delivering the wafer between the treatment section and an exposure processing unit provided outside the system.

When the wafer is treated in this coating and developing treatment system, air cleaned by an air cleaner or the like is supplied as down-flowing air into the coating and developing treatment system in order to prevent impurities such as particulates from adhering to the wafer, while an atmosphere in the coating and developing treatment system is exhausted, whereby the wafer can be treated in a clean condition.

In recent years, however, exposure technology in which a beam with a shorter wavelength (for example, 157 nm) is used is being developed to form a finer and more precise circuit pattern. When the beam with the short wavelength is used, there is a fear that even impurities at molecular level such as oxygen, ozone, and water vapor which have been insignificant so far exert a bad influence on exposure processing, whereby a precise circuit pattern is not formed.

Hence, when at least the wafer is subjected to exposure processing, it is required that no impurities such as oxygen adhere onto the wafer. If only clean air is supplied as in prior arts, the adhesion of impurities onto the wafer can not be suppressed effectively since impurities such as oxygen are contained in the air, and moreover impurities adhering onto the wafer can not be removed.

SUMMARY OF THE INVENTION

The present invention is made in view of such a point, and its object is to remove impurities at molecular level such as oxygen adhering to a substrate such as a wafer in a coating and developing treatment system and a coating and developing treatment method.

To attain this object, according to a first aspect of the present invention, the present invention is a coating and developing treatment system for performing coating and developing treatment for a substrate, comprising: a treatment section having a coating treatment unit for forming a coating film on the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit; an interface section having a second carrier unit for carrying the substrate through a route at least between the treatment section and an exposure processing unit provided outside the system for performing exposure processing for the substrate; and a pressure reducing and removing unit for removing impurities adhering to the coating film on the substrate by suction in a chamber before the substrate is subjected to the exposure processing.

Incidentally, the second carrier unit needs to only gave a function of carrying the substrate into/out of the treatment section, and need not have a function of carrying the substrate into/out of the exposure processing unit provided outside the system. In addition to particulates such as dust, impurities at molecular level such as oxygen, ozone, water vapor, and organic substances are also included in the aforesaid impurities.

According to another aspect of the present invention, the present invention is a coating and developing treatment system for performing coating and developing treatment for a substrate, comprising: a treatment section having a coating treatment unit for forming a coating form on the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit; an interface section having a second carrier unit for carrying the substrate through a route at least between the treatment section and an exposure processing unit provided outside the system for performing exposure processing for the substrate; a delivery section which is connected between the interface section and the exposure processing unit and hermetically closeable; and a pressure reducing unit for reducing a pressure in the delivery section to a predetermined set pressure.

According to still another aspect of the present invention, a coating and developing treatment method of the present invention is a method for performing coating and developing treatment to a substrate, comprising the steps of: supplying a coating solution to the substrate to form a coating film on the substrate; exposing the substrate by irradiating a predetermined beam to the substrate on which the coating film is formed; developing the substrate after the exposure processing; removing impurities adhering to the substrate from the substrate between the step of forming the coating film and the step of exposing the substrate.

According to the present invention, the impurities adhering to the coating film on the substrate are removed by the pressure reducing and removing unit, whereby exposure processing of the substrate is performed suitably without being influenced by the impurities. Accordingly, even if exposure is performed with a beam having a short wavelength of 157 nm or less, for example, there is no possibility that any defect occurs to the substrate after exposure. Although it is thought that a clean atmosphere is always maintained in the vicinity of the substrate in order to prevent impurities from adhering to the substrate, it is difficult to produce an atmosphere from which oxygen and water vapor at molecular level are removed completely, and thus there is a limit to the prevention of adhesion of impurities. Hence, it is more practical and effective to provide a unit capable of removing impurities which has already adhered as in the present invention. The position of the pressure reducing and removing unit may be inside the coating and developing treatment system or may be outside the coating and developing treatment system. Moreover, since a solvent in a treatment solution can be also vaporized simultaneously in the pressure reducing and removing unit, it is also possible to simultaneously perform such vaporization treatment which has been hitherto performed by heating.

According to the present invention, the delivery section which is connected between the interface section and the exposure processing unit and is hermetically closeable and the pressure reducing unit for reducing the pressure in the delivery section are provided, whereby the substrate passes through the delivery section before exposure processing at which time the pressure in the delivery section can be reduced. If the pressure in the delivery section is reduced, impurities at molecular level such as oxygen adhering to the surface of the substrate can be detached from the substrate and removed. As a result, exposure processing thereafter can be performed suitably without being adversely affected by the impurities. Hence, even if exposure is performed with a beam having a short wavelength of 157 nm or less, for example, there is no possibility that any defect occurs to the substrate after exposure. Moreover, since the solvent in the treatment solution can be also vaporized simultaneously, it is also possible to simultaneously perform such vaporization treatment which has been hitherto performed by heating.

DETAILED DESCRIPTION OF THE PREFERRED EMBODIMENT

Figure 1:
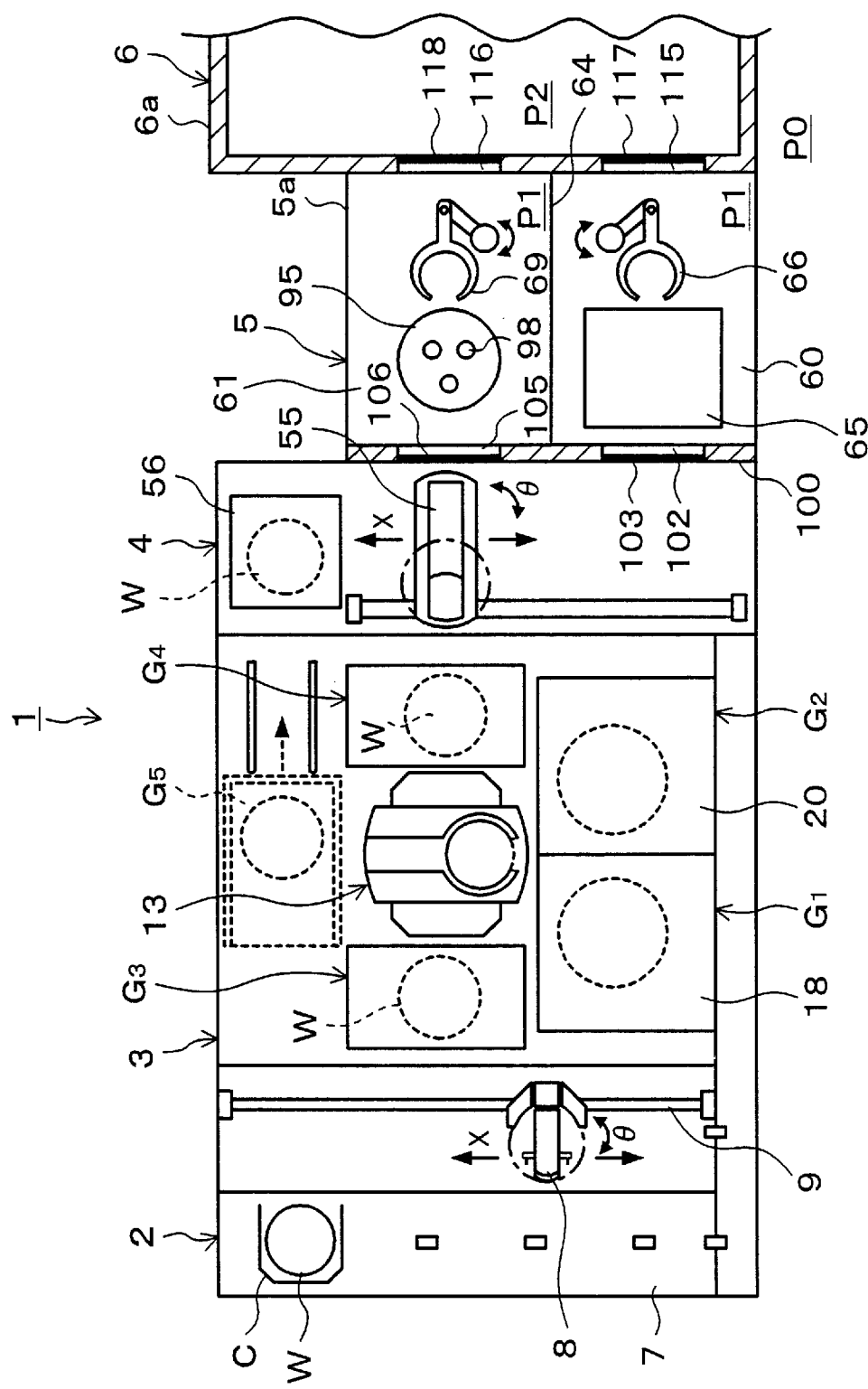
FIG. 1 is an explanatory plan view of a coating and developing treatment system according to an embodiment.
Figure 2:
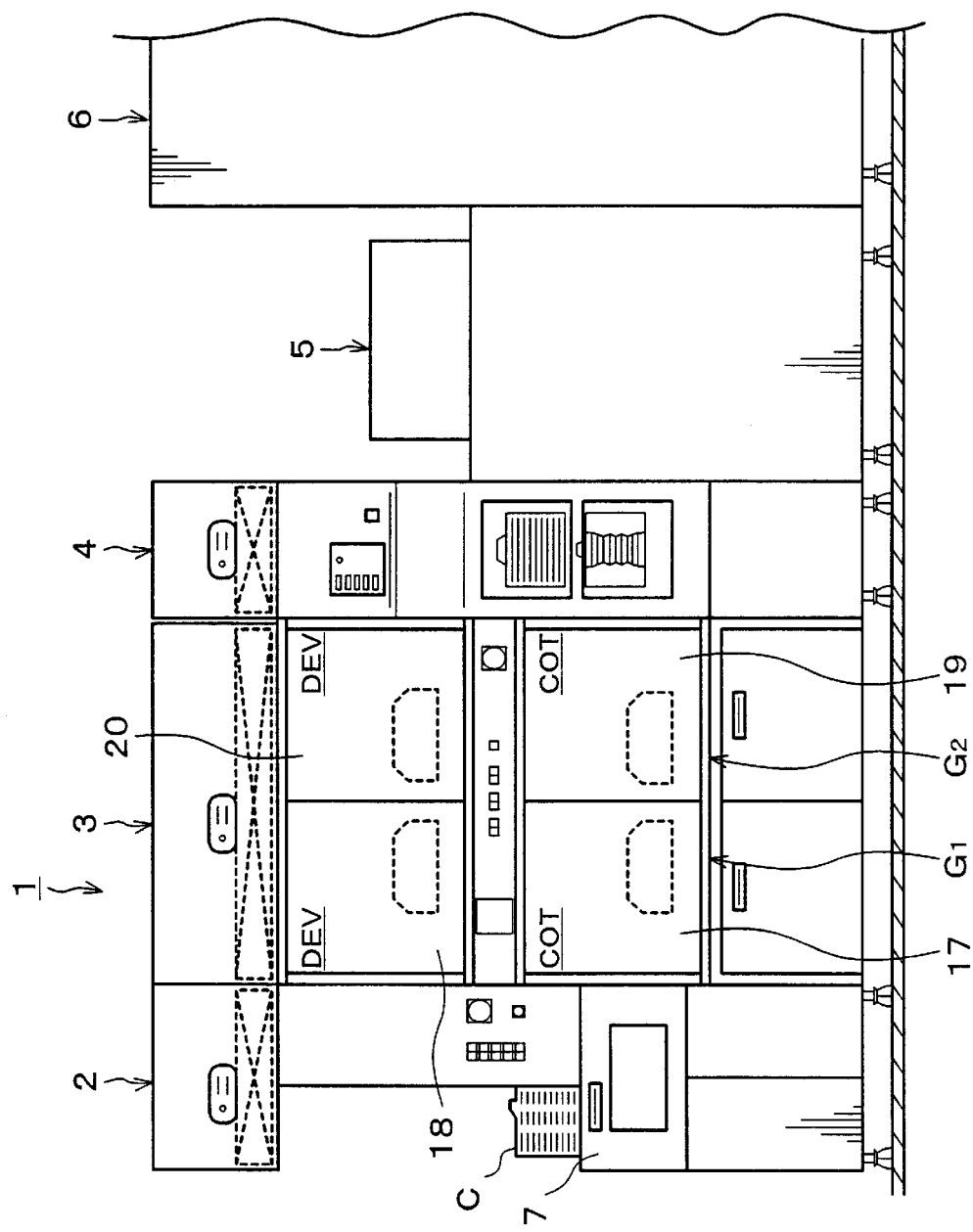
FIG. 2 is a front view of the coating and developing treatment system in FIG. 1.
Figure 3:
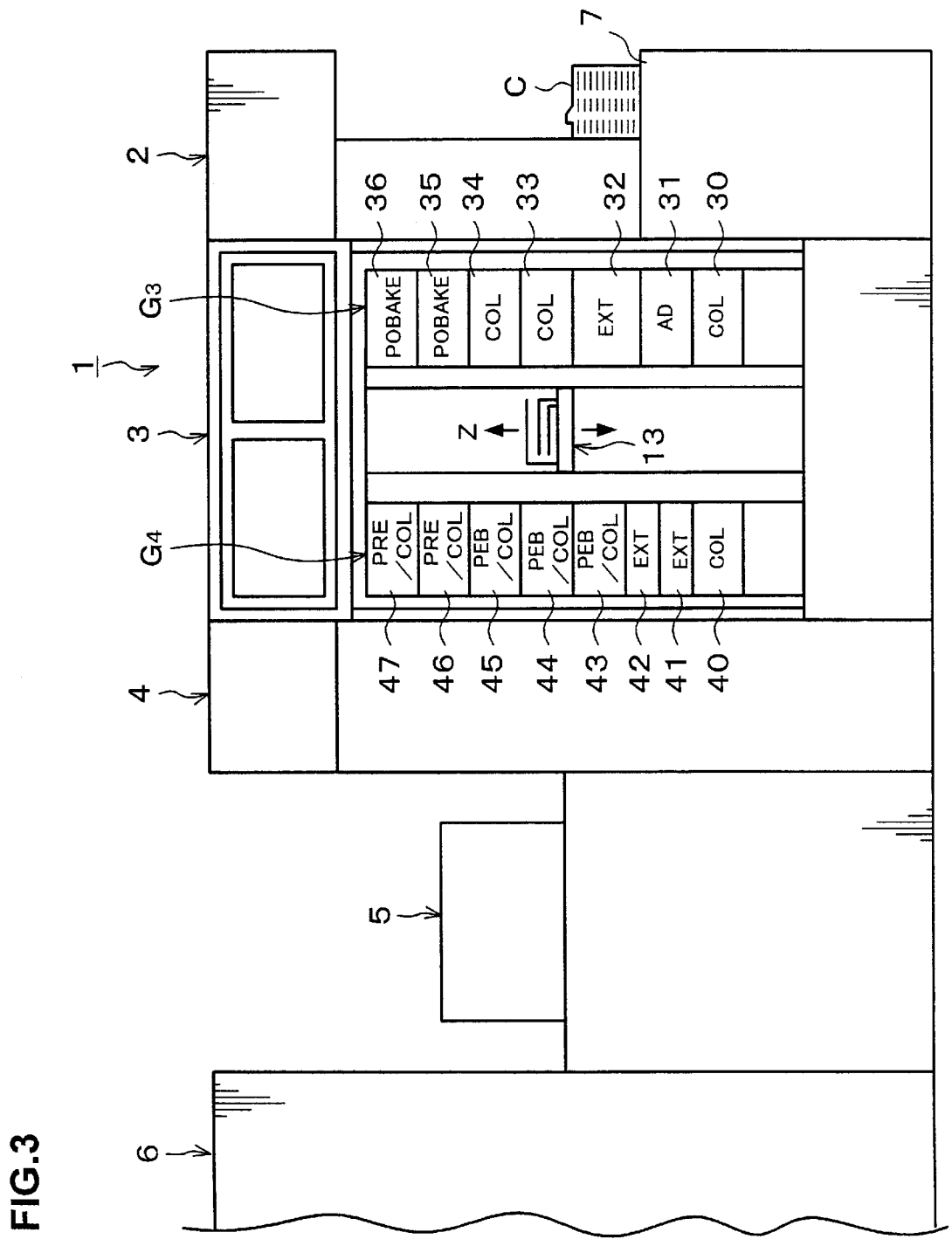
FIG. 3 is a rear view of the coating and developing treatment system in FIG. 1.

Preferred embodiments of the present invention will be explained below. FIG. 1 is a plan view of a coating and developing treatment system 1 according to a first embodiment, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for transferring, for example, 25 wafers W per cassette, as a unit, from/to the outside into/from the coating and developing treatment system 1 and carrying the wafer W into/out of a cassette C, a processing station 3 as a treatment section where various kinds of treatment units each of which performs predetermined treatment for the wafers W one by one in a coating and developing process are stacked in multiple tiers, an interface section 4 which is provided adjacent to the processing station 3 and a part of a route used when the wafer W is carried between the processing station 3 and an exposure processing unit 6 provided outside the coating and developing treatment system 1, and a delivery section 5 provided between the interface section 4 and the exposure processing unit 6, where the delivery of the wafer W between the interface section and the exposure processing unit 6 is performed are integrally connected.

In the cassette station 2, a plurality of cassettes C are freely mounted in a line in an X-direction (in a top-to-bottom direction in FIG. 1) at predetermined positions on a cassette mounting table 7. A wafer carrier 8 movable in the direction of arrangement of the cassettes (the X-direction) and in the direction of arrangement of the wafers W housed in the cassette C (a Z-direction, i.e., vertical direction) can freely move along a carrier path 9 and selectively get access to each of the cassettes C.

The wafer carrier 8 has an alignment function of aligning the wafer W. This wafer carrier 8 is structured to be able to get access to an extension unit 32 and an adhesion unit 31 which are included in a third treatment unit group G3 on the processing station 3 side as will be described later.

In the processing station 3, a main carrier unit 13 as a first carrier unit is disposed in the middle thereof, and around the main carrier unit 13, various treatment units are stacked in multiple tiers to compose treatment unit groups. In this coating and developing treatment system 1, four treatment unit groups G1, G2, G3, and G4 are disposed. The first and second treatment unit groups G1 and G2 are disposed on the front side of the coating and A developing treatment system 1. The third treatment unit group G3 is disposed adjacent to the cassette station 2. The fourth treatment unit group G4 is disposed adjacent to the interface section 4. Moreover, a fifth treatment unit group G5 shown by a broken line can be additionally disposed on the rear side as an option. The main carrier unit 13 can carry the wafer W into/out of various treatment units which are disposed in these treatment unit groups G1, G2, G3, and G4 and will be described later.

In the first treatment unit group G1, for example, as shown in FIG. 2, a resist coating unit 17 for coating the wafer W with a resist solution and a developing treatment unit 18 for subjecting the wafer W after exposure processing to developing treatment are stacked in two tiers from the bottom in order. Similarly, in the second treatment unit group G2, a resist coating unit 19 and a developing treatment unit 20 are stacked in two tiers from the bottom in order.

In the third treatment unit group G3, for example, as shown in FIG. 3, a cooling unit 30 for subjecting the wafer W to cooling treatment, an adhesion unit 31 for enhancing adhesion of the resist solution and the wafer W, an extension unit 32 for temporarily making the wafer W wait, cooling units 33 and 34 for cooling the wafer W after developing treatment, postbaking units 35 and 36 for subjecting the wafer W after developing treatment to heat treatment, or the like are stacked, for example, in seven tiers from the bottom in order.

In the fourth treatment unit group G4, for example, a cooling unit 40, extension units 41 and 42 for mounting the wafer W before and after exposure processing and temporarily making the wafer W wait, heat and cooling treatment units 43, 44 and 45 (PEB/COL in FIG. 3) for heating the wafer W after exposure processing and thereafter cooling the wafer W to a predetermined temperature, heat and cooling treatment units 46 and 47 (PRE/COL in FIG. 3) for heating the wafer W in order to vaporize a solvent in a resist solution and thereafter cooing the wafer W to a predetermined temperature, or the like are stacked, for example, in eight tiers from the bottom in order.

Figure 4:
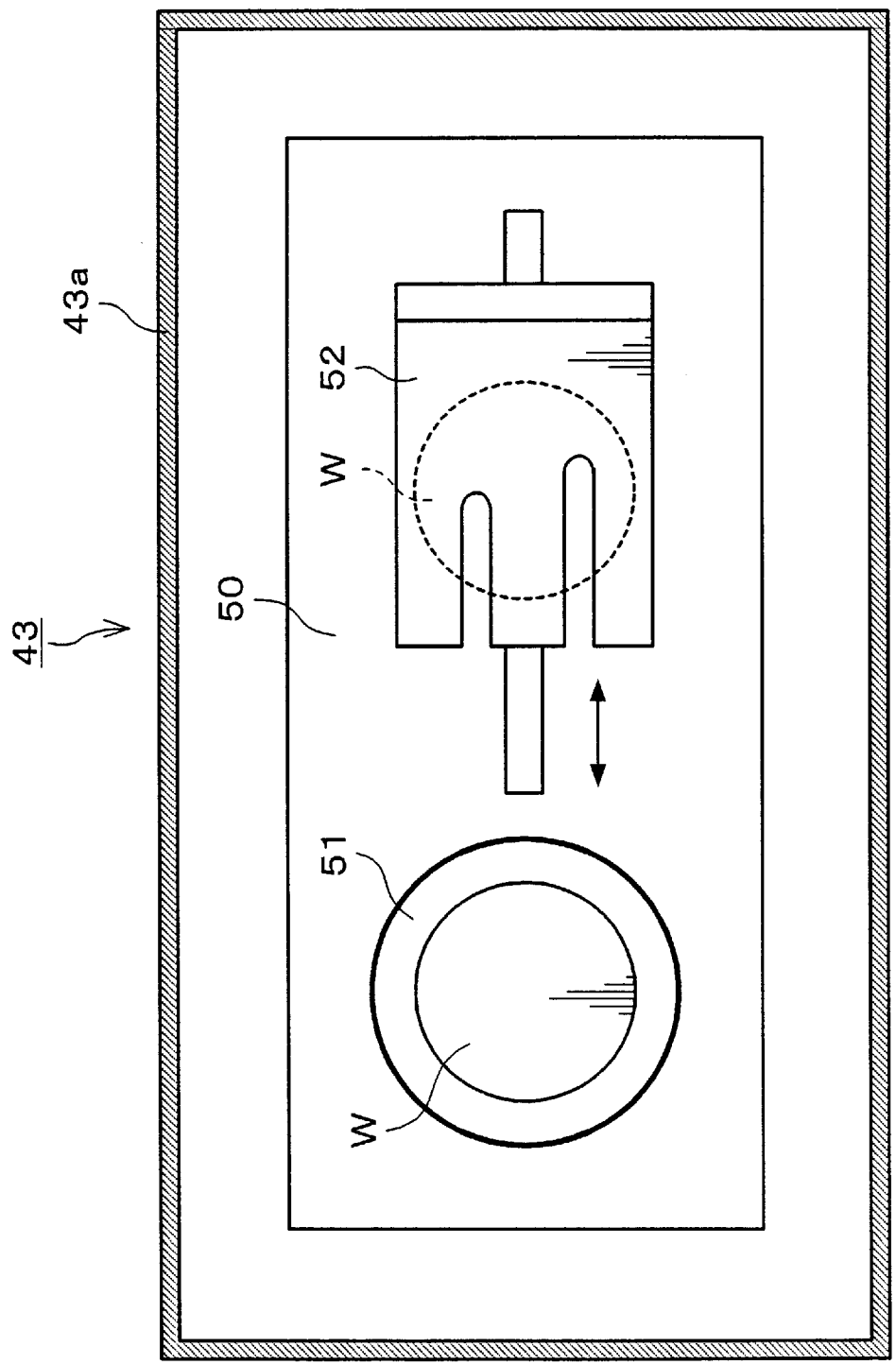
FIG. 4 is a schematic horizontal sectional view showing a heat and cooling treatment unit in the coating and developing treatment system in FIG. 1.

As shown in FIG. 4, the heat and cooling treatment unit 43 has a disc-shaped hot plate 51 for heating the wafer W and a chill plate 52 which moves onto the hot plate 51 to receive the wafer W from the hot plate 51 and cools the wafer W, on a base 50 in a casing 43a. The heat and cooling treatment unit 43 performs heat and cooling treatment for the wafer W continuously in the same unit, whereby a thermal budget given to the wafer W by heating can be kept always constant. The other heat and cooling treatment units 44 to 47 have the same structure.

As shown in FIG. 1, a wafer carrier 55 as a second carrier unit is provided in the middle of the interface section 4. The wafer carrier 55 is structured to be freely movable in the X-direction (the top-to-bottom direction in FIG. 1) and the Z-direction (the vertical direction) and rotatable in a θ-direction (the direction of rotation around a Z-axis) so as to be able to get access to the extension units 41 and 42 included in the fourth treatment unit group G4, a peripheral exposure unit 56, and the delivery section 5 to carry the wafer W to each of them.

The delivery section 5 is surrounded by a casing 5a which has a tunnel shape and a square section, so that atmospheres in other areas do not easily flow into the delivery section 5.

The delivery section 5 has a first route 60 through which the wafer W passes when being transferred from the interface section 4 to the exposure processing unit 6 and a second route 61 through which the wafer W passes when being transferred from the exposure processing unit 6 to the interface section 4. A partition plate 64 is provided between the first route 60 and the second route, whereby atmospheres in the first route 60 and the second route 61 do not interfere with each other.

In the first route 60, a pressure reducing and removing unit 65 for removing impurities such as oxygen adhering to a resist film on the wafer W by suction in a reduced-pressure chamber, and a wafer carrier mechanism 66 as a third carrier unit capable of carrying the wafer W to the pressure reducing and removing unit 65 and the exposure processing unit 6 are provided.

Figure 5:
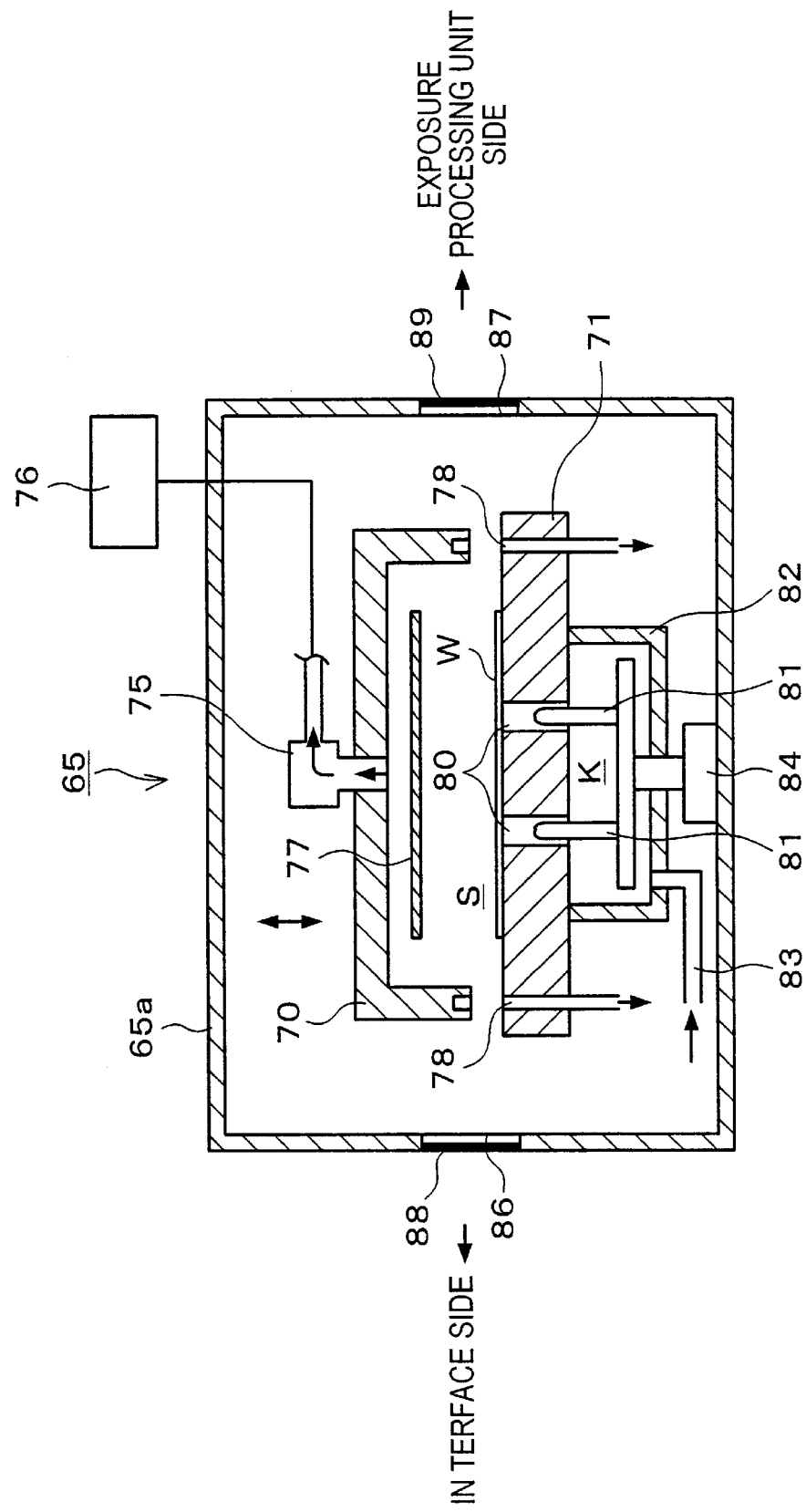
FIG. 5 is an explanatory view of a vertical section showing the structure of a pressure reducing and removing unit in a delivery section.

Now, the structure of the pressure reducing and removing unit 65 will be explained in detail. As shown in FIG. 5, the pressure reducing and removing unit 65 has a lid body 70 with its lower face open which has an almost cylindrical shape and is vertically movable, and a mounting stand 71 which is located under the lid body 70 and forms a reduced-pressure chamber S as a chamber integrally with the lid body 70 in a casing 65a.

An exhaust pipe 75 for exhausting an atmosphere in the reduced-pressure chamber S is provided in the center of an upper face of the lid body 70, and communicates with a suction unit 76. By the operation of the suction unit 76, the atmosphere in the reduced-pressure chamber S is sucked from the exhaust pipe 75, an atmospheric current is formed in the reduced-pressure chamber S, and the pressure in the reduced-pressure chamber S is reduced. A current plate 77 is provided at the upper portion inside the lid body 70, and hence when the pressure in the reduced-pressure chamber S is reduced, turbulence of the atmospheric current formed in the reduced-pressure chamber S is suppressed, whereby the atmosphere in the reduced-pressure chamber S can be exhausted uniformly.

The mounting stand 71 has a thick disc shape, and the wafer W can be mounted thereon. The mounting stand 71 is provided with a temperature controller not illustrated, for example, a Peltier element or the like. By controlling the mounting stand 71 at a predetermined temperature, the temperature of the wafer W mounted on the mounting stand 71 can be maintained uniformly within the surface of the wafer W. A plurality of suction ports 78 may be provided at positions opposite to a lower end of the lid body 79 of the mounting stand 71. When the lower end of the lid body 70 is brought into contact with the mounting stand 71 in forming the reduced-pressure chamber S, the close attachment of the lid body 70 and the mounting stand 71 is maintained by suction force from these suction ports 78. Through-holes 80 which vertically penetrate the mounting stand 71 are provided near the center of the mounting stand 71, and raising and lowering pins 81 which will be described later can be raised and lowered in the through-holes 80.

Provided under the mounting stand 71 is an almost cylindrical container 82 which forms a release chamber K integrally with a lower face of the mounting stand 71. This release chamber K communicates with the reduced-pressure chamber S via the through-holes 80. A vent pipe 83 for releasing an atmosphere in the release chamber K to the atmospheric air is provided in a lower face of the container 82, whereby the atmosphere in the reduced-pressure chamber S can be released to the atmospheric air through the through-holes 80 and the release chamber K. The raising and lowering pins 81 for raising and lowering the wafer W are provided in the container 82 and can be freely raised and lowered in the through-holes 80 by a raising and lowering movement mechanism 84.

Carrier openings 86 and 87 for carrying the wafer W in and out are provided respectively on the interface section 4 side and the exposure processing unit 6 side of the casing 65a. Shutters 88 and 89 are provided at the carrier openings 86 and 87 respectively.

Provided in the second route 61 are a mounting table 95 on which the wafer W which has undergone exposure processing is temporarily mounted when being transferred into the interface section 4 and a wafer carrier mechanism 69 as a fourth carrier unit for carrying the wafer W in the exposure processing unit 6 to the mounting table 95.

The mounting table 95 has a disc shape, and near the center thereof, raising and lowering mechanisms 98 for raising and lowing the mounted wafer W are provided. By means of these raising and lowering mechanisms 98, the wafer W can be delivered between the mounting table 95, and the wafer carrier mechanism 69 and the wafer carrier 55.

A partition plate 100 for partitioning off an atmosphere in the delivery section 5 from an atmosphere in the interface section 4 is provided between the delivery section 5 and the interface section 4. A transit opening 102 is provided at a position facing the pressure reducing and removing unit 65 of the partition plate 100, and thereby the wafer W can be carried from the interface section 4 to the pressure reducing and removing unit 65 by the wafer carrier 55. In addition, a shutter 103 for opening and closing the transit opening 102 is provided at the transit opening 102. The shutter 103 is opened only when the wafer W passes through the transit opening 102, and closed except that time.

A transit opening 105 is provided at a position facing the mounting table 95 of the partition plate 100, and thereby the wafer W can be carried from the mounting table 95 into the interface section 4 by the wafer carrier 55. In addition, a shutter 106 for freely opening and closing the transit opening 105 is provided at the transit opening 105. The shutter 106 is opened only when the wafer W passes through the transit opening 105.

Figure 6:
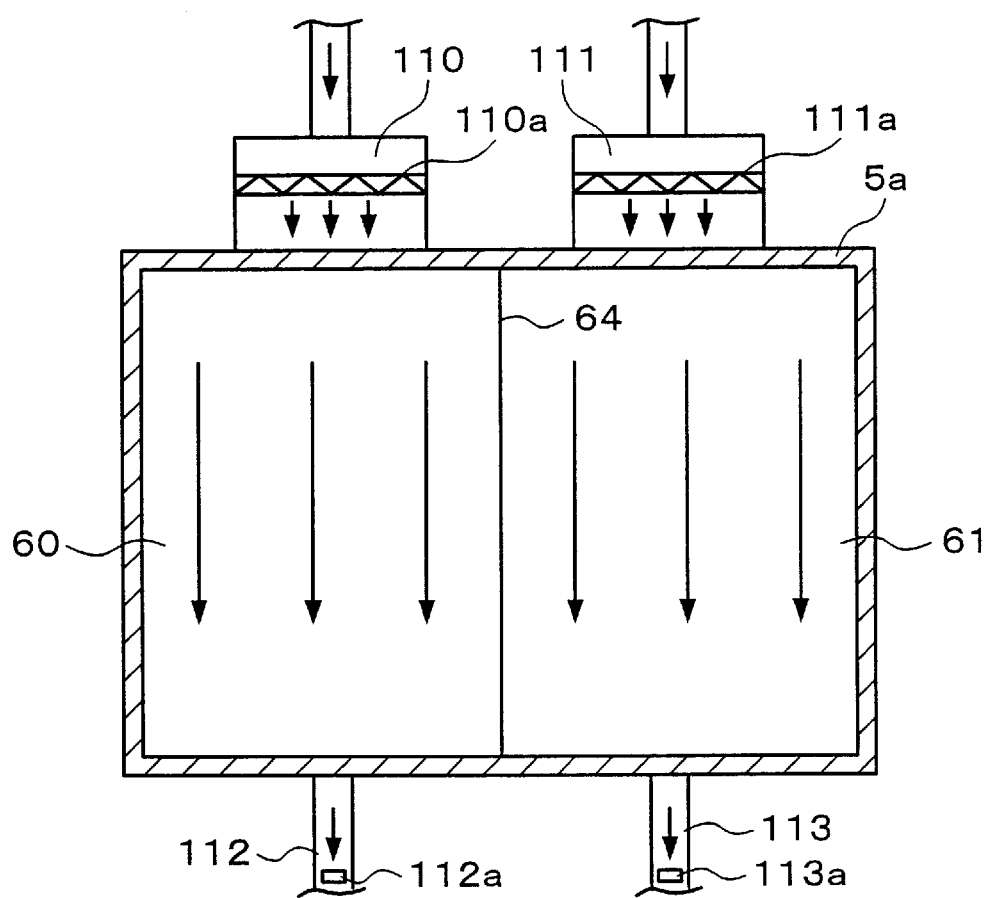
FIG. 6 is an explanatory view of a vertical section showing the state of the flow of an inert gas in the delivery section of the coating and developing treatment system in FIG. 1 as seen from an exposure processing unit.

On top of the respective routes structured as above, that is, the first route 60 and the second route 61 of the delivery section 5, gas supply units 110 and 111 each for supplying an inert gas are provided separately as shown in FIG. 6, and a predetermined inert gas can be supplied from the gas supply unit 110 into the first route 60 and from the gas supply unit 111 into the second route 61.

Filter units 110a and 111a are provided in these gas supply units 110 and 111 respectively. These filter units 110a and 111a each have a function of controlling the inert gas with a predetermined concentration supplied from a supply source or the like not illustrated at predetermined temperature and humidity, and have a ULPA filter for removing particulates in the inert gas and a chemical filter for neutralizing alkaline components contained in the inert gas. Accordingly, the cleaned inert gas of which the temperature and humidity are controlled according to each route can be supplied to the first route 60 and the second route 61.

Exhaust pipes 111 and 112 as exhaust means are provided at the bottom of the first route 60 and the second route 61 respectively so as to exhaust an atmosphere in each route. Thus, the inert gas supplied into the respective routes from the gas supply units 110 and 111 is exhausted from the exhaust pipes 112 and 113 through the respective routes, and as a result, impurities such as oxygen, ozone, and water vapor in the respective routes are purged, and a clean atmosphere can be maintained in each route. Moreover, the pressures in the respective routes can be controlled at a predetermined pressure by controlling supply quantities of the inert gas from the gas supply units 110 and 111 corresponding to the respective routes.

Furthermore, concentration sensors 112a and 113a for measuring the concentration of impurities are provided in the exhaust pipes 112 and 113. Signals from these concentration sensors 112a and 113a are sent to a control unit (not illustrated), and performed is such control that the supply quantity of the inert gas is increased when the concentration is higher than a specified concentration, while the supply quantity thereof is decreased when the concentration is lower.

The exposure processing unit 6 for subjecting the wafer W to exposure processing is provided adjacent to the delivery section 5 as shown in FIG. 1. This exposure processing unit 6 is hermetically closed by a casing 6a, so that an atmosphere in the exposure processing unit 6 can be tightly controlled. A transit opening 115 through which the wafer W is carried in from the first route 60 and a transit opening 116 through which the wafer W is carried out to the second route 61 are provided on the delivery section 5 side of the casing 6a, and shutters 117 and 118 for opening and closing the transit opening 115 and 116 respectively are provided at the transit openings 115 and 116.

Next, a photolithography process performed in the coating and developing treatment system 1 structured as above will be explained.

Before starting the treatment of the wafer W, the inert gas which is controlled at the predetermined temperature and humidity, for example, 23° C. and 45%, and from which particulates are removed is supplied into the respective routes, that is, the first route 60 and the second route 61 of the delivery section 5 by the gas supply units 110 and 111. A clean atmosphere which contains no particulates nor impurities such as oxygen is substituted for an atmosphere in each route and maintained in that condition. A pressure P1 in the delivery section 5 and a pressure P2 in the exposure processing unit 6 at this time are set to have a relation of P2>P1, which prevents an atmosphere in the delivery section 5 from flowing into the exposure processing unit 6.

The pressures P1 and P2 are set higher than a pressure P0 in a clean room where the coating and developing treatment system 1 is installed, thereby preventing an atmosphere in the clean room which contains impurities, particulates, and the like from directly flowing into the coating and developing treatment system 1. The temperatures, humidities, or concentrations of the inert gas to be supplied to the respective routes may be the same as described above, or may be different if necessary.

When the treatment of the wafer W is started, first in the cassette station 2, one untreated wafer W is taken out of the cassette C and carried into the adhesion unit 31 in the third treatment unit group G3 by the wafer carrier 8.

The wafer W which is coated with an adhesion promoter such as HMDS which promotes adhesion with the resist solution in the adhesion unit 31 is then transferred to the cooling unit 30 by the main carrier unit 13 and cooled to a predetermined temperature. Thereafter, the wafer W is transferred to the resist coating unit 17 or 19 and subjected to resist coating treatment. The wafer W on which a resist film is formed is transferred to the heat and cooling treatment unit 46 or 47 (PRE/COL in FIG. 3) to be subjected to heat and cooling treatment. On this occasion, instead of performing heat treatment and cooling treatment sequentially in respective units provided separately, heat and cooling treatment is performed in a single unit such as the heat and cooling treatment unit 46 or 47, whereby the time required from the heat treatment to the cooling treatment of the wafer W can be kept always constant, and consequently a thermal budget given to the wafer by heating can be made the same among the wafers W. Moreover, in this embodiment, all the heat and cooling treatment between the resist coating treatment and the developing treatment are performed by means of the heat and cooling treatment units 43 to 47, whereby the time required from the resist coating treatment to the developing treatment can be made the same for all the wafers W.

Thereafter, the wafer W is carried to the extension unit 41, and then carried from the extension unit 41 to the peripheral exposure unit 56 in the interface section 4 by the wafer carrier 55. The wafer W the peripheral portion of which is exposed in the peripheral exposure unit 56 is again held by the wafer carrier 55 and carried to the pressure reducing and removing unit 65 in the first route 60 of the delivery section 5 through the transit opening 102. At this time, the shutter 103 is opened. After the wafer W is transferred into the pressure reducing and removing unit 65, the shutter 103 is closed again.

Now, the process of removing impurities performed in the pressure reducing and removing unit 65 will be explained in detail. First, the shutter 88 on the interface section 4 side of the casing 65*a* shown in FIG. 5 is opened, and the wafer W is carried into the casing 65*a* by the aforesaid wafer carrier 55. The wafer W is delivered to the raising and lowering pins 81, and with the descent of the raising and lowering pins 81, the wafer W is mounted on the mounting stand 71 which is maintained at a predetermined temperature, for example, 23° C. On this occasion, a change in the conduction of heat occurs due to pressure reduction, and hence it is desirable that a temperature control mechanism be provided in the mounting stand 71 so as to positively control the temperature. It is advisable that the temperature control mechanism on this occasion can control the temperature in the range of 15° C. to 30° C.

When the lid body 70 is lowered and the lower end of the lid body 70 is brought into contact with the mounting stand 71, the reduced pressure chamber S is formed, at which time suction from the suction ports 78 is started, and the lid body 70 and the mounting stand 71 are closely attached by the suction force thereof. Thereafter, when the suction unit 76 is operated, and an atmosphere in the reduced-pressure chamber S starts to be exhausted from the exhaust pipe 75, an atmospheric current is formed in the reduced-pressure chamber S, and impurities adhering to the wafer W are exhausted together with the atmospheric current. Incidentally, it is desirable that the set pressure of the suction unit 76 at this time be not more than 200 Pa to 300 Pa so as to remove the impurities adhering onto the wafer W. The pressure in the reduced-pressure chamber S is reduced to a predetermined pressure, and after a predetermined period of time, for example, several minute at the longest, the suction unit 76 is stopped. Desired pressure reducing and removing treatment is performed by the aforesaid process.

In this case, it is desirable to control the suction quantity from the suction ports 78 so that the quantity reaches the maximum immediately after the wafer W is carried into the reduced-pressure chamber S, that is, immediately after the lid body 70 and the mounting stand 71 are closely attached.

Moreover, it is suitable to form an optical window at a portion of the lid body 70 and measure whether the impurities are removed from the wafer W or not by a proper optical measuring sensor.

Subsequently, the vent pipe 83 is opened, and the pressure in the reduced-pressure chamber S is returned to the original pressure. After the suction from the suction ports 78 is stopped, the lid body 70 is raised.

The wafer W is then raised by the raising and lowering pins 81 and delivered to the wafer carrier mechanism 66 on the exposure processing unit 6 side. When the wafer W carried out of the pressure reducing and removing unit 65 through the transit opening 87 of the casing 65*a* and, the process of removing the impurities from the wafer W is completed.

Thereafter, the shutter 117 of the casing 6*a* of the exposure processing unit 6 is opened, and the wafer W is carried into the exposure processing unit 6 through the transit opening 115 by the wafer carrier mechanism 66.

Subsequently, a predetermined pattern is exposed on the wafer W in the exposure processing unit 6. The wafer W which has undergone exposure is carried from the exposure processing unit 6 into the second route 61 through the transit opening 116 by the wafer carrier mechanism 69 in the second route 62, at which time the shutter 118 is opened, and closed again after the wafer W passes it.

The wafer W carried into the second route 61 is moved to a position above the mounting table 95, and delivered to the raising and lowering mechanisms 98 of the mounting table 95. Thereafter, the wafer W is temporarily placed on the mounting table 95.

The wafer W is transferred from the mounting table 95 to the extension unit 42 in the processing station 3 through the transit opening 105 with the shutter 106 open and the interface section 4 by the wafer carrier 55. The wafer W is then carried to the heat and cooling treatment unit 43, 44, or 45 by the main carrier unit 13 and subjected to heat and cooling treatment after exposure treatment in order.

Thereafter, the wafer W is transferred to the developing treatment unit 18 or 20 and subjected to developing treatment. The wafer W subjected to the developing treatment is transferred to the postbaking unit 35 or 36 and heated. The wafer W is then transferred to the cooling unit 33 or 34 and cooled to a predetermined temperature. The wafer W is then transferred to the extension unit 32 of the third treatment unit group, and returned therefrom to the cassette C in the cassette station 2 by the wafer carrier 8. The successive photolithography process is completed through the aforesaid steps.

According to the aforesaid embodiment, the delivery section 5 is provided between the interface section 4 and the exposure processing unit 6, and the pressure reducing and removing unit 65 is provided in the delivery section 5, whereby impurities adhering to the resist film on the wafer W can be removed before the wafer W is subjected to exposure processing. Hence, exposure processing of the wafer W can be performed suitably without being influenced by the impurities such as oxygen.

Moreover, the inert gas from which impurities and particulates are removed is supplied into the delivery section 5, and thereby a clean atmosphere is maintained in the delivery section 5, which prevents the impurities and the like from adhering to the wafer W before and after exposure processing. Although the wafer W before exposure processing is already cleaned by the pressure reducing and removing unit 65, impurities can be prevented from adhering again to the wafer W already cleaned.

The shutters 103 and 106 are provided between the interface section 4 and the delivery section 5, which suppresses the entry of an atmosphere containing the impurities in the interface section 4 into the delivery section 5, resulting in the maintenance of a clean atmosphere in the delivery section 5.

Further, the pressure P1 in the delivery section 5 is set lower than the pressure P2 in the exposure processing unit 6, which can prevent the atmosphere in the delivery section 5 from flowing into the exposure processing unit 6 in which the atmosphere is tightly controlled.

Furthermore, since the delivery section 5 is divided into the first route 60 and the second route 61, the process of transferring the wafer W from the interface section 4 to the exposure processing unit 6 via the pressure reducing and removing unit 65 and returning the wafer W from the exposure processing unit 6 to the interface section 4 again is performed smoothly.

Although the delivery section 5 is provided between the interface section 4 and the exposure processing unit 6, and the pressure reducing and removing unit 65 is provided in the delivery section 5 in the aforesaid embodiment, this pressure reducing and removing unit 65 may be also provided in the interface section 4. Such a case will be explained below as a second embodiment.

Figure 7:
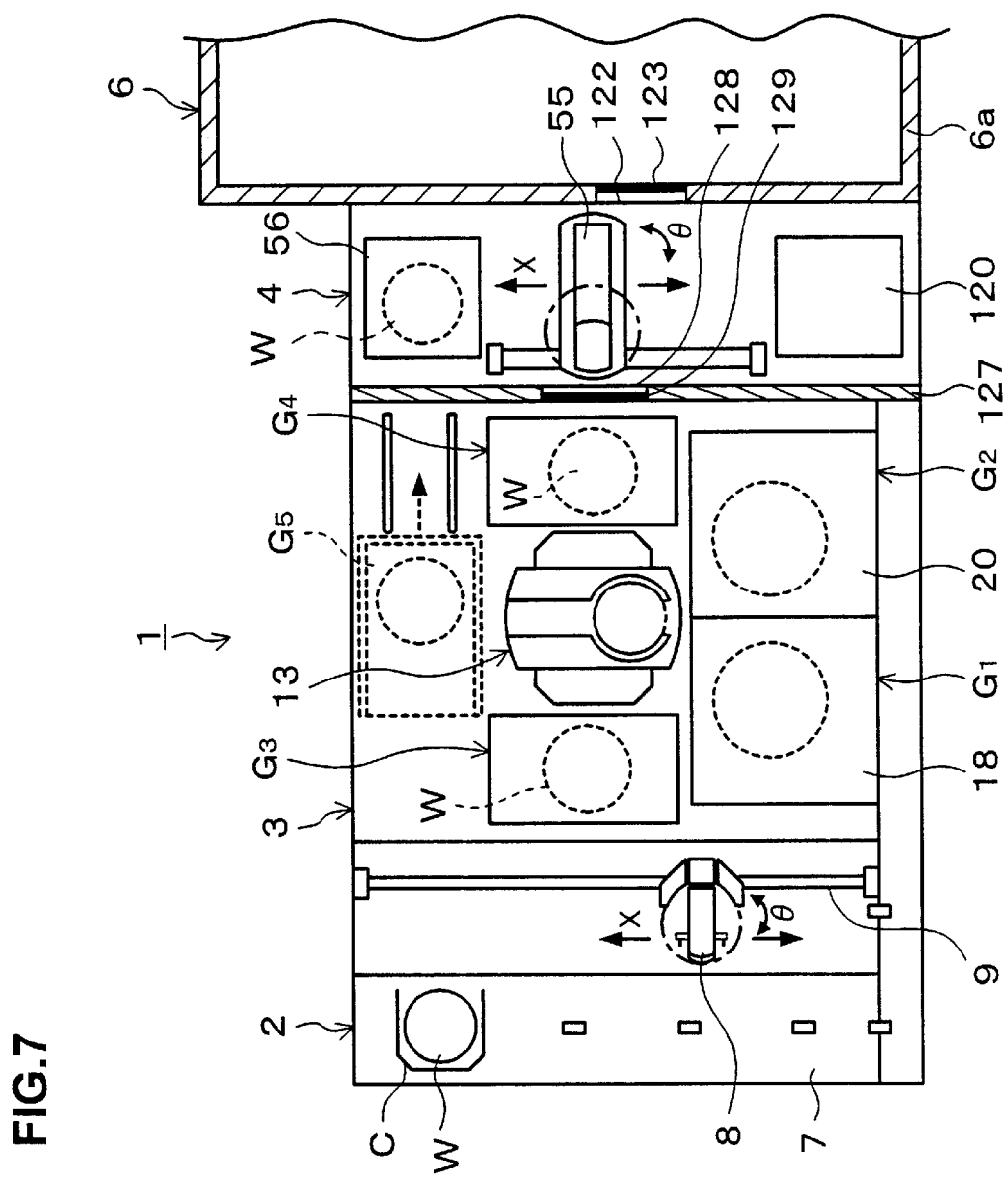
FIG. 7 is an explanatory plan view of a coating and developing treatment system according to a second embodiment.

In the second embodiment, for example, as shown in FIG. 7, a pressure reducing and removing unit 120 is provided on the front side of the interface section 4 in the coating and developing treatment system 1 and at a position accessible by the wafer carrier 55. The exposure processing unit 6 is provided adjacent to the interface section 4, and provided in its casing 6a are a single transit opening 122 and a shutter 123 for opening and closing the transit opening 122.

Figure 8:
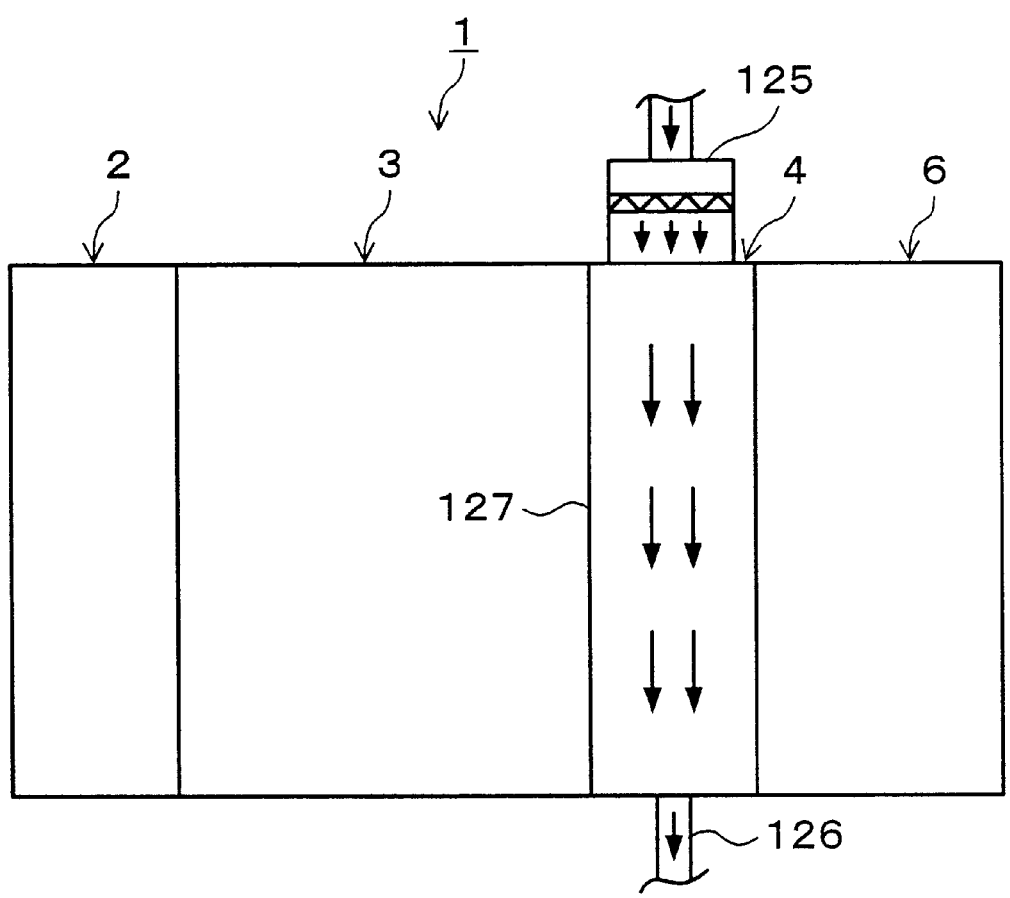
FIG. 8 is an explanatory view of a vertical section showing the flow of the inert gas supplied to an interface section in the coating and developing treatment system in FIG. 7.

A gas supply unit 125 having the same structure as the aforesaid gas supply unit 110 as shown in FIG. 8 is provided on the top of the interface section 4, and thereby it is possible to supply the inert gas into the interface section 4 and maintain a clean atmosphere in the interface section 4. An exhaust pipe 126 as an exhaust means for exhausting an atmosphere in the interface section 4 is provided at the bottom of the interface section 4.

A partition plate 127 for partitioning off an atmosphere in the interface section 4 from an atmosphere in the processing station 3 is provided between the interface section 4 and the processing station 3. At a position facing the extension units 41 and 42 of the fourth treatment unit group G4 of the partition plate 127, a transit opening 128 and a shutter 129 for opening and closing the transit opening 128 are provided, which prevents the atmosphere in the processing station 3 from flowing into the interface section 4.

A photolithography process in the second embodiment structured as above will be explained. First, the inert gas is supplied into the interface section 4 from the gas supply unit 125, and a clean atmosphere is substituted for the atmosphere in the interface section 4 and maintained.

When the treatment of the wafer W is started, the wafer W is transferred from the cassette station 2 to the processing station 3, subjected to adhesion treatment, resist coating treatment, and heat and cooling treatment in sequence, and thereafter transferred to the extension unit 41 in the same manner as the first embodiment.

The wafer W is then carried to the peripheral exposure unit 56 in the interface section 4 by the wafer carrier 55, and thereafter carried into the pressure reducing and removing unit 120. In this pressure reducing and removing unit 120, the impurities and the like adhering onto the wafer W are removed in the same way as the first embodiment. The cleaned wafer W is held again by the wafer carrier 55, carried into the exposure processing unit 6 through the transit opening 122, and subjected to exposure processing. The wafer W which has undergone the exposure processing is carried to the extension unit 42 in the processing station 3 by the wafer carrier 55.

Thereafter, as in the first embodiment, the wafer W is subjected to heat and cooling treatment, developing treatment, and the like in the processing station 3, and finally returned to the cassette station 2, and the successive photolithography process is completed.

By providing the pressure reducing and removing unit 120 in the interface section 4 as described above, it is possible to attach the unit for removing the impurities from the wafer W to the system which has the same size as an existing coating treatment system, whereby the system can be made smaller than that in the first embodiment.

In the aforesaid embodiments, the pressure reducing and removing unit is provided in the delivery section 5 or the interface section 4, but it may be provided in other places, for example, in the exposure processing unit 6, in the processing station 3, or the like. In such a case, as long as the impurities are removed from the wafer W before exposure processing, the exposure processing is performed suitably, and thereby the same effect can be obtained.

Figure 9:
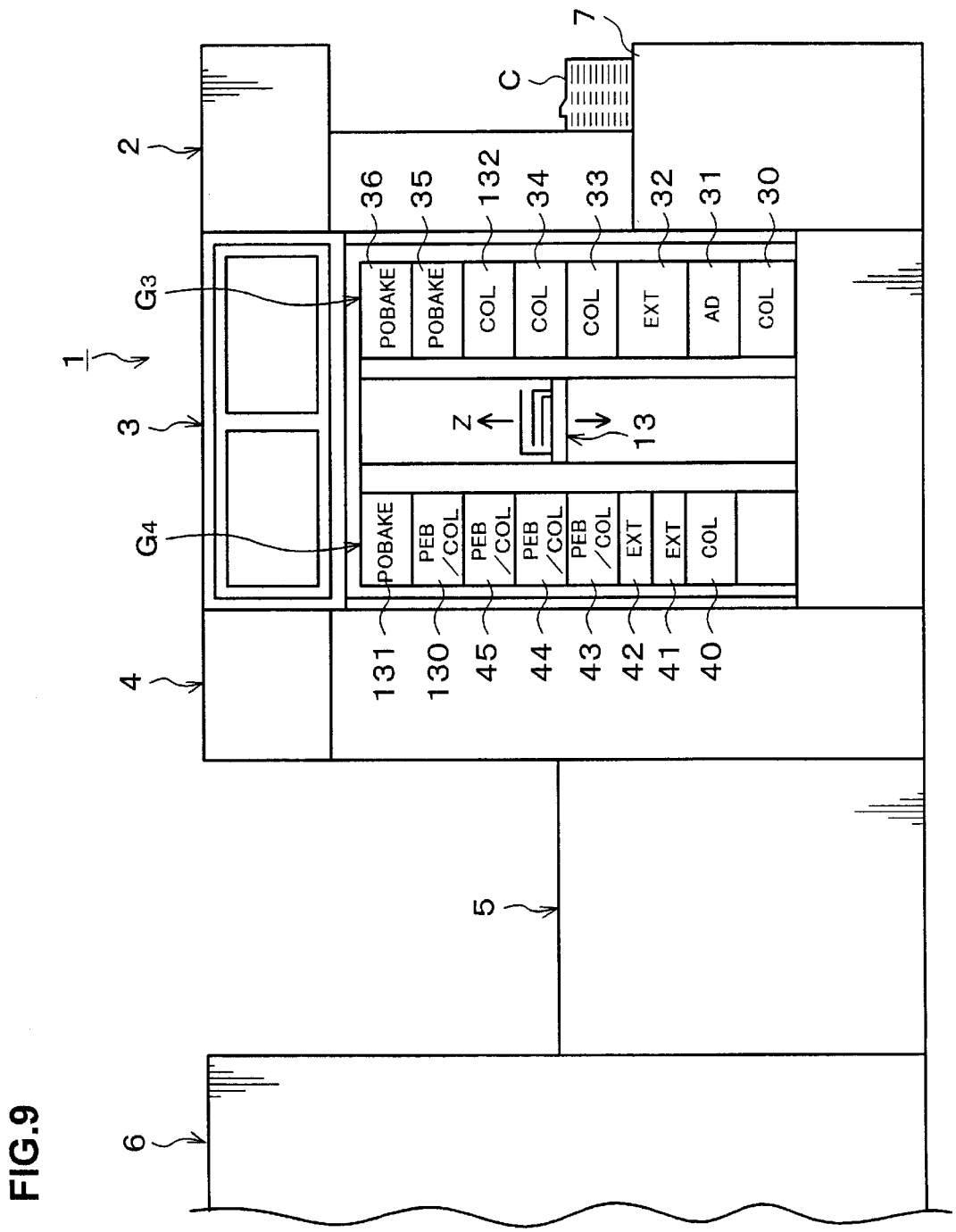
FIG. 9 is an explanatory view showing an example of arrangement of heat and cooling treatment units in the coating and developing treatment system when the treatment for vaporizing a solvent in a resist solution is performed in the pressure reducing and removing unit.

Moreover, the treatment for vaporizing the solvent in the resist solution which is performed in the heat and cooling treatment unit 46 or 47 in the aforesaid embodiments may be performed in the pressure reducing and removing unit 65. In this case, for example, as shown in FIG. 9, instead of the heat and cooling treatment units 46 and 47 (PRE/COL), a heat and cooling treatment unit 130 (PEB/COL) for performing heat and cooling treatment after exposure and a heat treatment unit 131 for performing heat treatment after developing treatment are provided in the fourth treatment unit group G4 in the processing station 3, and a cooling treatment unit 132 for performing cooling treatment for the wafer W after heat treatment after exposure is added to the treatment unit group G3.

When the wafer W is carried into the pressure reducing and removing unit 65 and mounted on the mounting stand 71, the pressure in the reduced-pressure chamber S is reduced to a predetermined pressure, for example, 133 Pa, at which the solvent in the resist solution is vaporized, at which time the aforesaid treatment for removing the impurities is performed. Thus, both the treatment for vaporizing the solvent and the treatment for removing the impurities can be performed simultaneously in the pressure reducing and removing unit 65. Accordingly, the treatment hitherto performed in the heat and cooling treatment unit 46 and 47 can be performed in the pressure reducing and removing unit 65. As a result, other thermal treatment units can be added instead of the units used for the treatment for vaporizing the solvent, whereby processing capability in the processing station 3 is improved. Even if the heat and cooling treatment units 46 and 47 are omitted without adding other thermal treatment units, the number of thermal treatment units can be reduced, resulting in the downsizing of the whole processing station 3.

Figure 10:
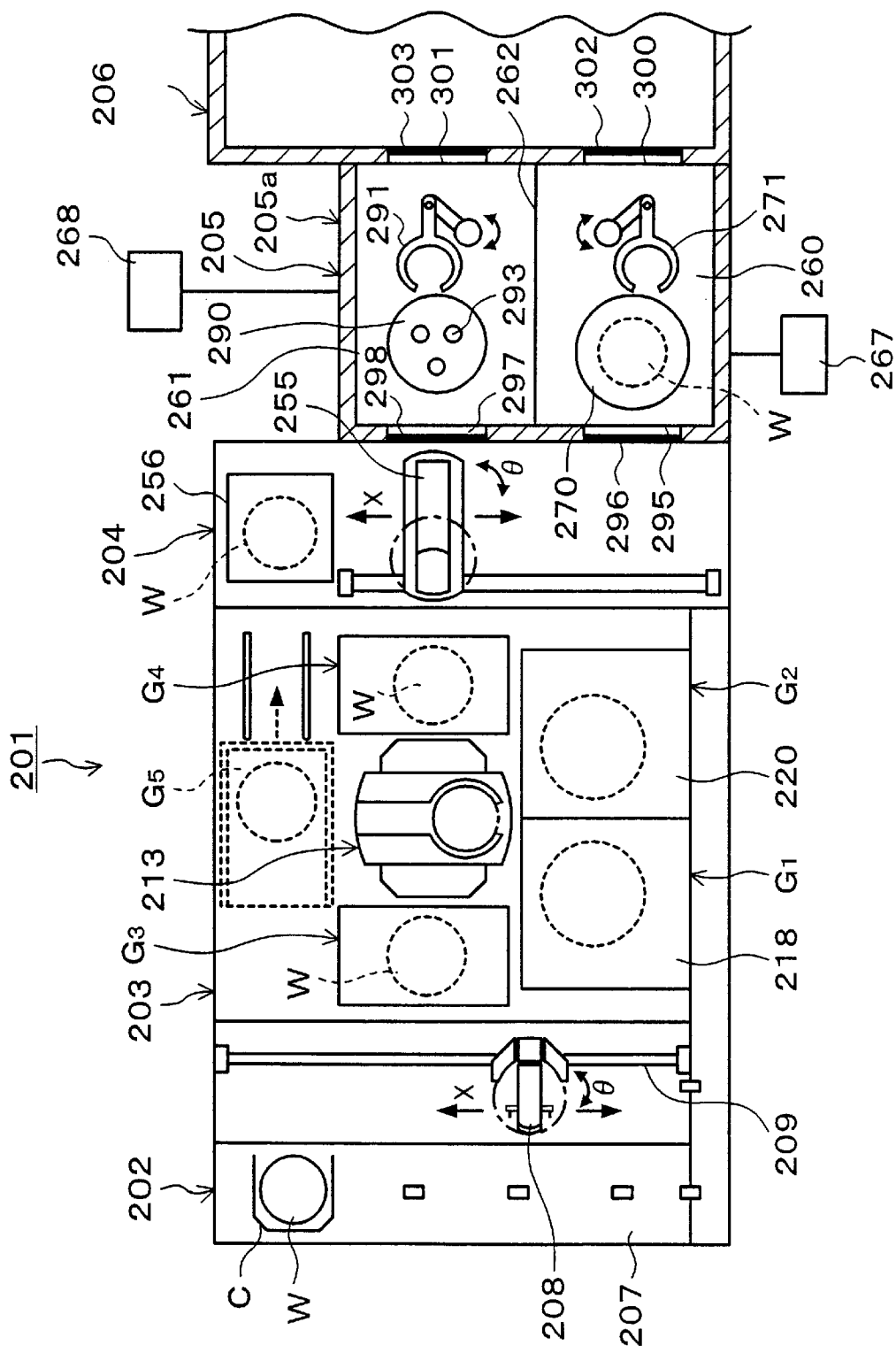
FIG. 10 is an explanatory plan view of a coating and developing treatment system according to a third embodiment.
Figure 11:
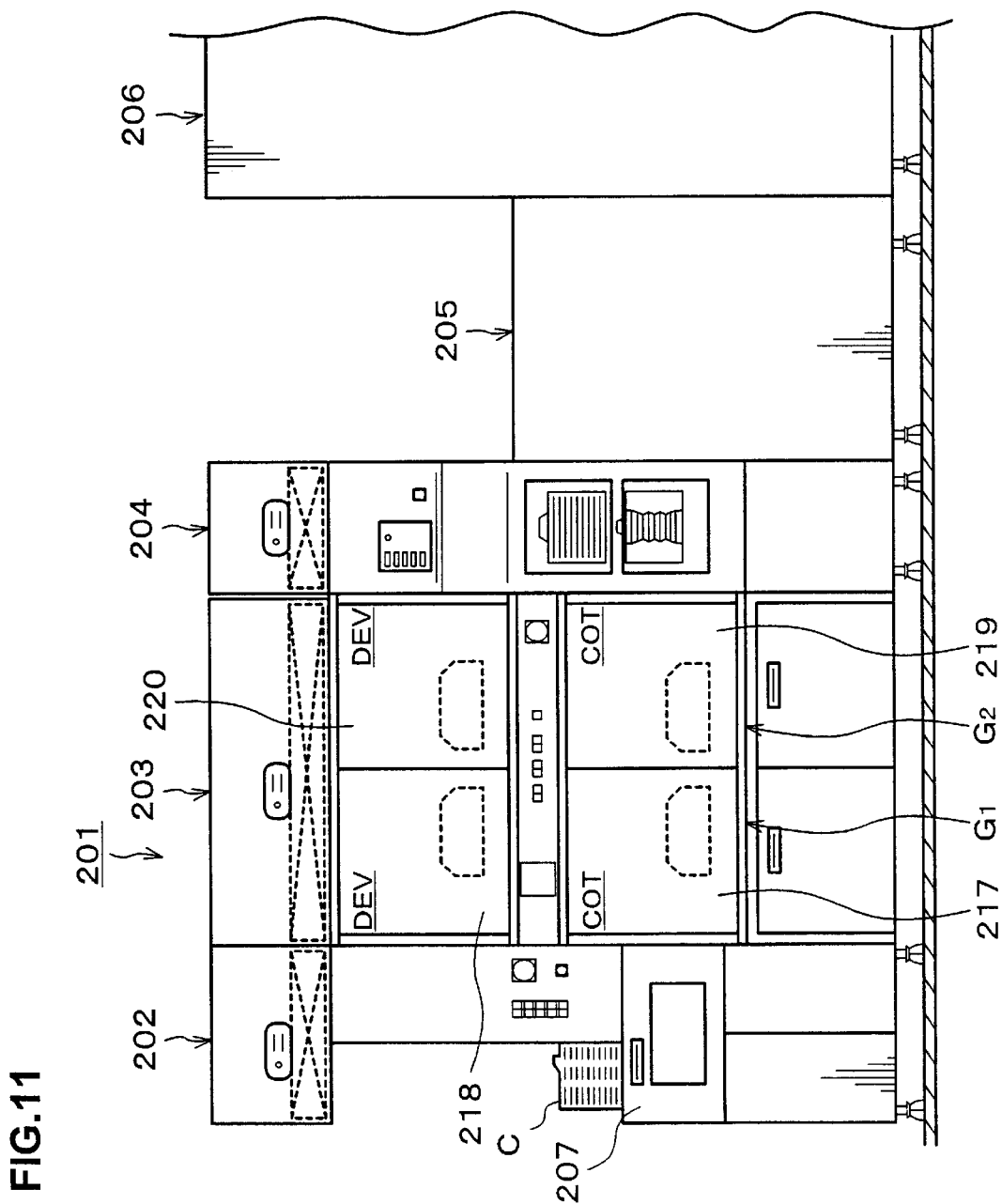
FIG. 11 is a front view of the coating and developing treatment system in FIG. 10.
Figure 12:
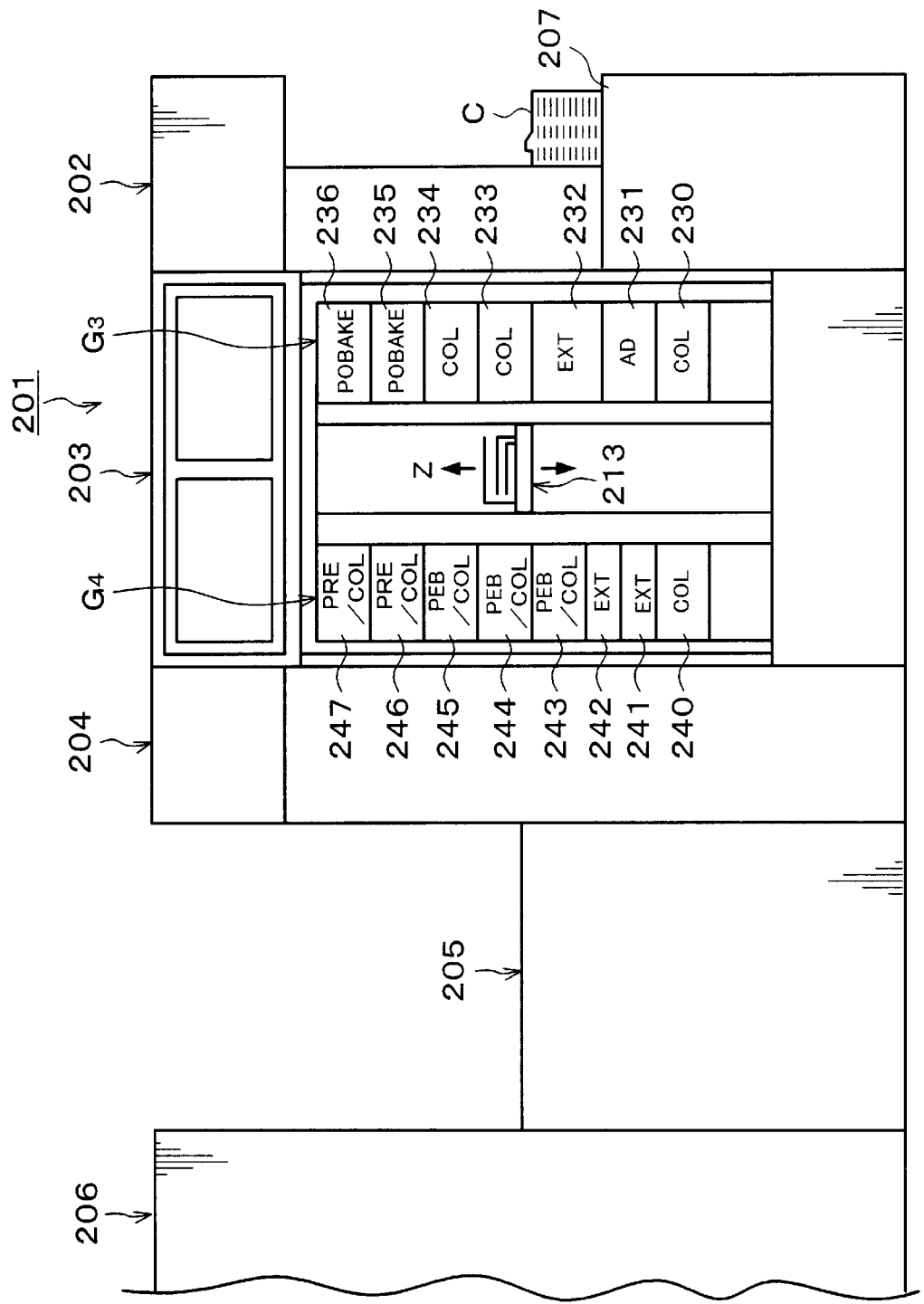
FIG. 12 is a rear view of the coating and developing treatment system in FIG. 10.

Still another embodiment will be explained. FIG. 10 is a plan view of a coating and developing treatment system 201 according to this embodiment, FIG. 11 is a front view of the coating and developing treatment system 201, and FIG. 12 is a rear view of the coating and developing treatment system 201.

As shown in FIG. 10, the coating and developing treatment system 201 has a structure in which a cassette station 202 for transferring, for example, 25 wafers W per cassette, as a unit, from/to the outside into/from the coating and developing treatment system 201 and carrying the wafer W into/out of a cassette C, a processing station 203 as the treatment section where various kinds of treatment units each of which performs predetermined treatment for the wafers W one by one in a coating and developing process are stacked in multiple tiers, an interface section 204 which is provided adjacent to the processing station 203 and a part of a route used for transferring the wafer W between the processing station 203 and an exposure processing unit 206 provided outside the coating and developing treatment system 201, and a delivery section 205 provided between the interface section 204 and the exposure processing unit 206, where the delivery of the wafer W between the interface section 204 and the exposure processing unit 206 is performed are integrally connected.

In the cassette station 202, a plurality of cassettes C are freely mounted in a line in the X-direction (in a top-to-bottom direction in FIG. 10) at predetermined positions on a cassette mounting table 207. A wafer carrier 208 movable in the direction of arrangement of the cassettes (the X-direction) and in the direction of arrangement of the wafers W housed in the cassette C (the Z-direction, i.e., vertical direction) can freely move along a carrier path 209 and selectively get access to each of the cassettes C.

The wafer carrier 208 has an alignment function of aligning the wafer W. This wafer carrier 208 is structured to be able to get access to an extension unit 232 and an adhesion unit 231 which are included in a third treatment unit group G3 on the processing station 203 side as will be described later.

In the processing station 203, a main carrier unit 213 as the first carrier unit is disposed in the middle thereof, and around the main carrier unit 213, various treatment units are stacked in multiple tiers to compose treatment unit groups. In this coating and developing treatment system 201, four treatment unit groups G1, G2, G3, and G4 are disposed. The first and second treatment unit groups G1 and G2 are disposed on the front side of the coating and developing treatment system 201. The third treatment unit group G3 is disposed adjacent to the cassette station 202. The fourth treatment unit group G4 is disposed adjacent to the interface section 204. Moreover, a fifth treatment unit group G5 shown by a broken line can be additionally disposed on the rear side as an option. The main carrier unit 213 can carry the wafer W into/out of various treatment units which are disposed in these treatment unit groups G1, G2, G3, and G4 and will be described later.

In the first treatment unit group G1, for example, as shown in FIG. 11, a resist coating unit 217 for coating the wafer W with the resist solution and a developing treatment unit 218 for subjecting the wafer W after exposure processing to developing treatment are stacked in two tiers from the bottom in order. Similarly, in the second treatment unit group G2, a resist coating unit 219 and a developing treatment unit 220 are stacked in two tiers from the bottom in order.

In the third treatment unit group G3, for example, as shown in FIG. 12, a cooling unit 230 for subjecting the wafer W to cooling treatment, an adhesion unit 231 for enhancing adhesion of the resist solution and the wafer W, an extension unit 232 for temporarily making the wafer W wait, cooling units 233 and 234 for cooling the wafer W after developing treatment, postbaking units 235 and 236 for subjecting the wafer W after developing treatment to heat treatment, or the like are stacked, for example, in seven tiers from the bottom in order.

In the fourth treatment unit group G4, for example, a cooling unit 240, extension units 241 and 242 for mounting the wafer W before and after exposure processing and temporarily making the wafer W wait, heat and cooling treatment units 243, 244 and 245 (PEB/COL in FIG. 12) for heating the wafer W after exposure processing and thereafter cooling the wafer W to a predetermined temperature, heat and cooling treatment units 246 and 247 (PRE/COL in FIG. 12) for heating the wafer W in order to vaporize the solvent in the resist solution and thereafter cooing the wafer W to a predetermined temperature, or the like are stacked, for example, in eight tiers from the bottom in order.

Figure 13:
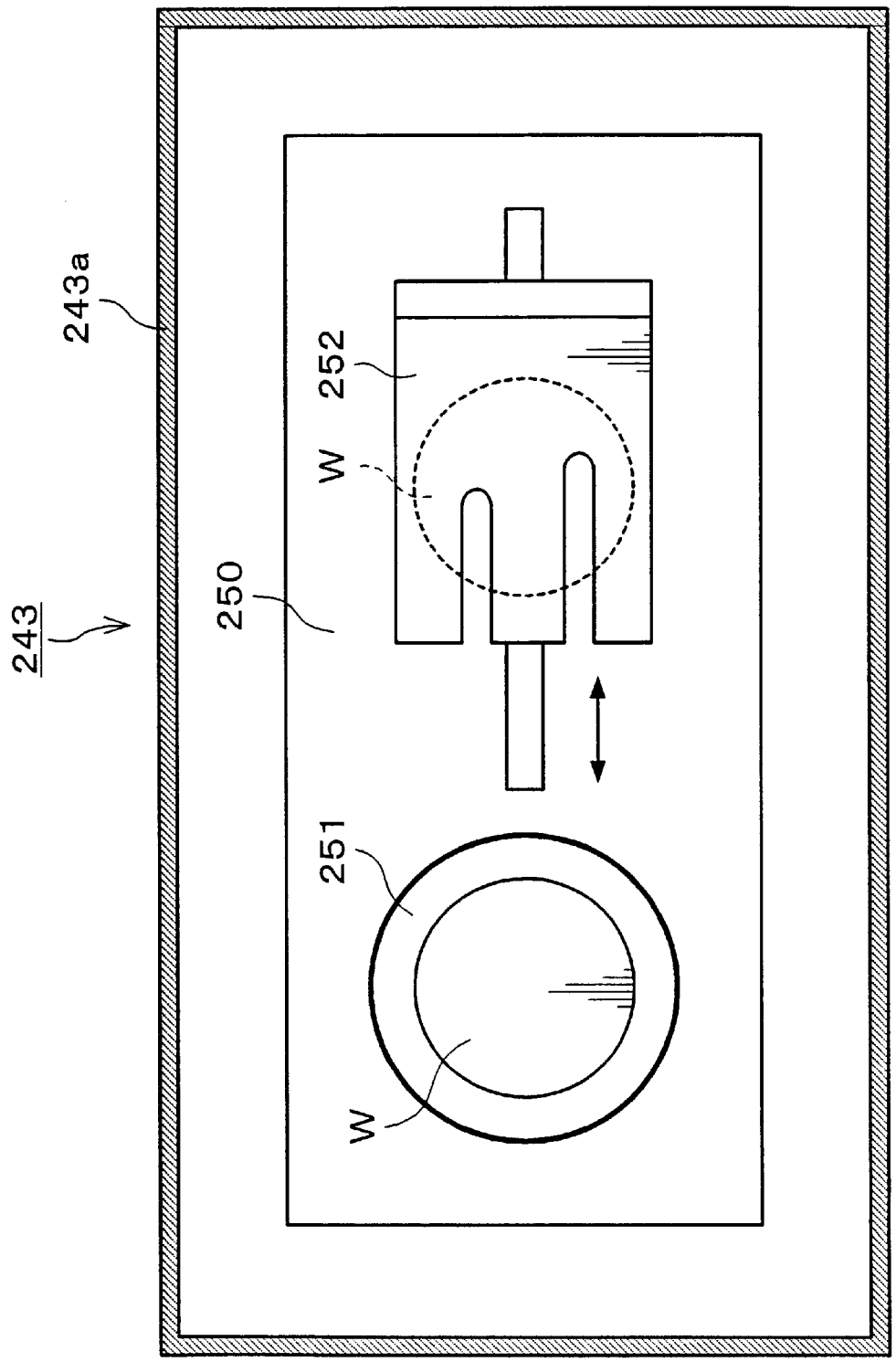
FIG. 13 is a schematic horizontal sectional view showing a heat and cooling treatment unit in the coating and developing treatment system in FIG. 10.

As shown in FIG. 13, the heat and cooling treatment unit 243 has a disc-shaped hot plate 251 for heating the wafer W and a chill plate 252 which moves onto the hot plate 251 to receive the wafer W from the hot plate 251 and cools the wafer W, on a base 250 in a casing 243a. The heat and cooling treatment unit 243 performs heat and cooling treatment for the wafer W continuously in the same unit, whereby a thermal budget given to the wafer W by heating can be kept always constant. The other heat and cooling treatment units 244 to 247 have the same structure.

As shown in FIG. 10, a wafer carrier 255 as the second carrier unit is provided in the middle of the interface section 204. The wafer carrier 255 is structured to be freely movable in the X-direction (the top-to-bottom direction in FIG. 10) and the Z-direction (the vertical direction) and rotatable in the θ-direction (the direction of rotation around the Z-axis) so as to be able to get access to the extension units 241 and 242 included in the fourth treatment unit group G4, a peripheral exposure unit 256, and the delivery section 205 to carry the wafer W to each of them.

The delivery section 205 is surrounded by a casing 205a which has a tunnel shape and a square section and is hermetically closeable, so that the pressure in the delivery section 205 can be easily reduced. The delivery section 205 has a first route 260 through which the wafer W passes when being transferred from the interface section 204 to the exposure processing unit 206 and a second route 261 through which the wafer W passes when being transferred from the exposure processing unit 206 to the interface section 204.

Figure 14:
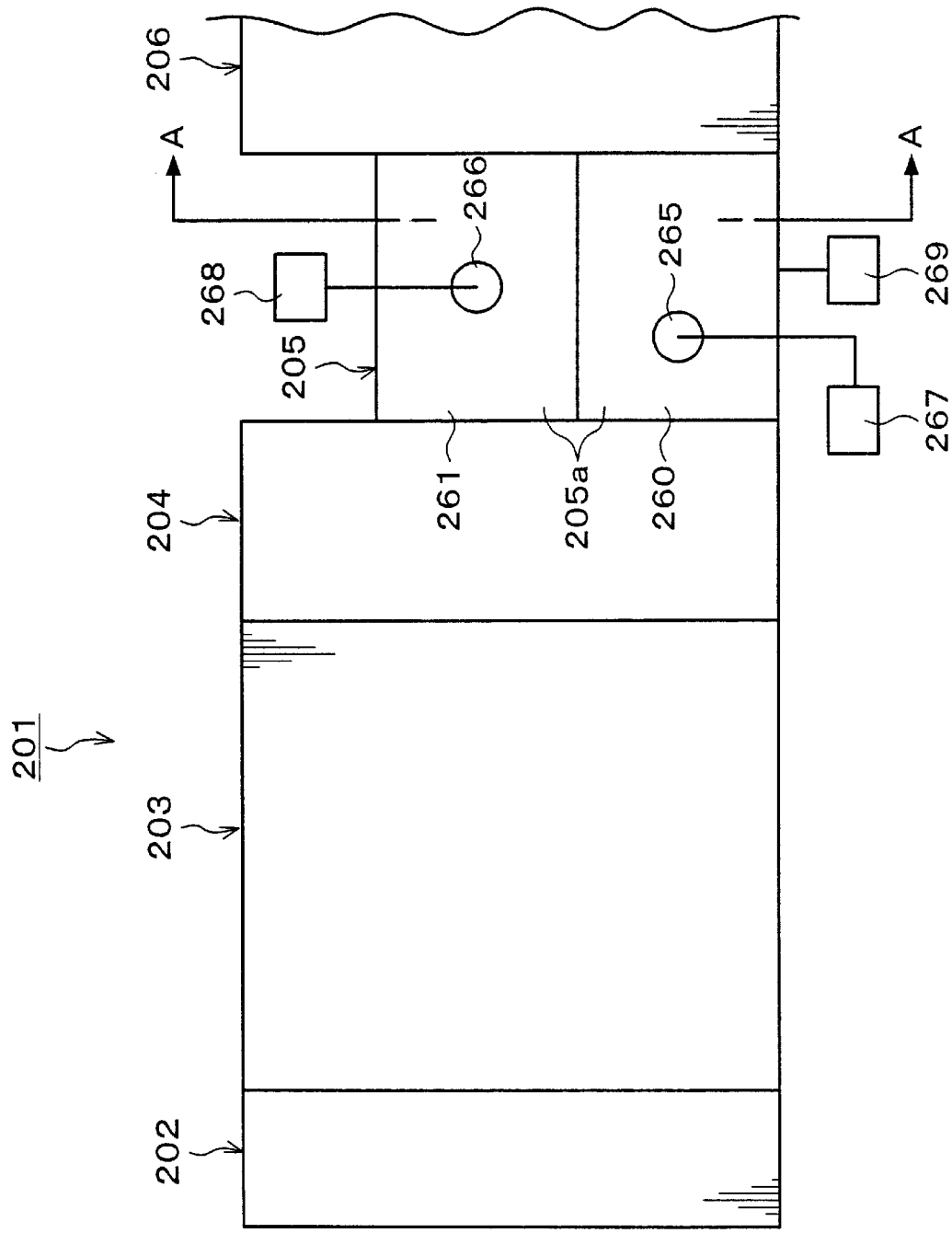
FIG. 14 is a explanatory plan view schematically showing the coating and developing treatment system in FIG. 10.
Figure 15:
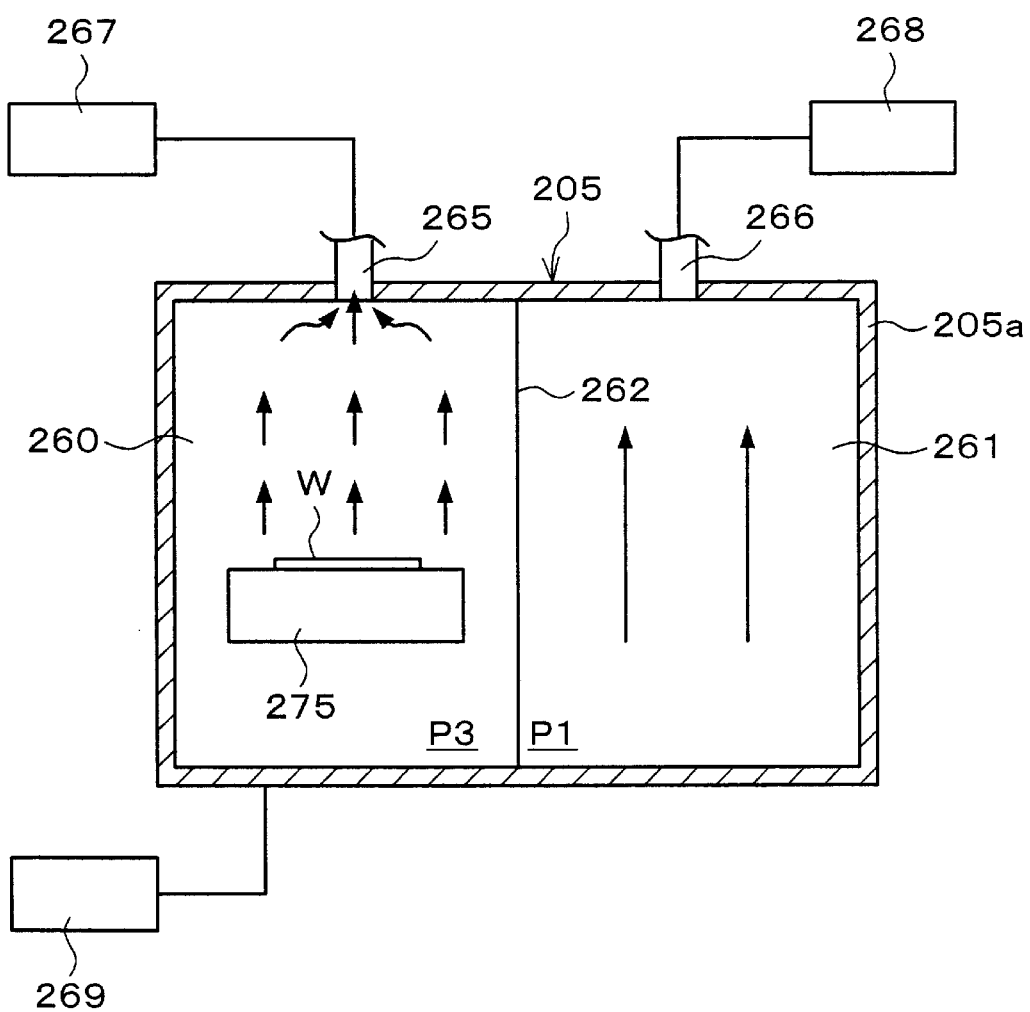
FIG. 15 is an explanatory view of a section taken along the line A—A shown in FIG. 14 of a delivery section of the coating and developing treatment system.

A partition plate 262 is provided between the first route 260 and the second route 261 so that the hermetic condition of each route is maintained. As shown in FIG. 14 and FIG. 15, suction pipes 265 and 266 for sucking an atmosphere in each route are provided on top of the first route 260 and the second route 261, and respectively communicate with pressure reducing units 267 and 258 each for sucking the atmosphere in each route to reduce the pressure therein to a predetermined set pressure.

The routes are partitioned off from each other and the pressure in each route can be set individually. Especially in the first route 260, impurities such as oxygen adhering to the resist film on the wafer W can be removed by reducing the pressure in the first route 260. A gas supply unit 269 for supplying the inert gas into the first route is provided in the first route 260 and supplies the inert gas into the first route 260 in predetermined timing so that the pressure in the first route 260 can be restored. This inert gas does not contain oxygen, ozone, water vapor, organic substances, and the like which are impurities, and nitrogen gas, neon gas, or the like is used as the inert gas.

Provided in the first route 260 are a mounting section 270 for temporarily mounting the wafer W in the first route 260 and removing the impurities such as oxygen adhering to the resist film on the wafer W and a wafer carrier mechanism 271 as the third carrier unit for carrying the wafer W from this mounting section 270 to the exposure processing unit 206.

Figure 16:
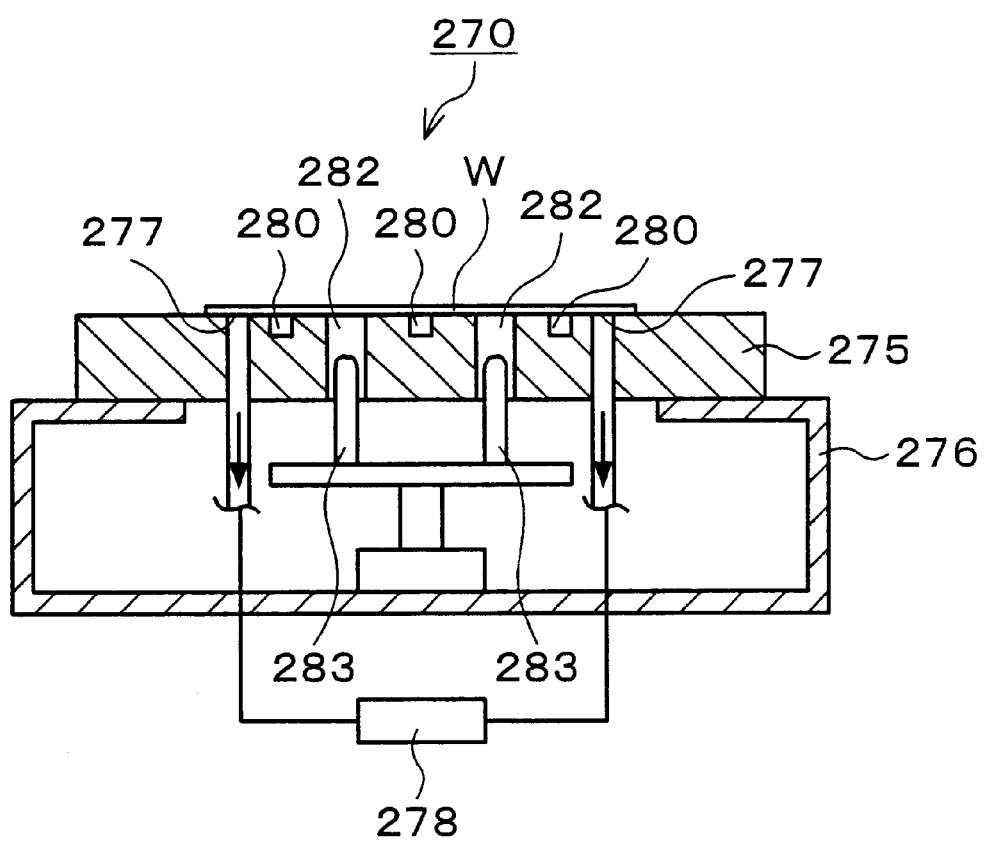
FIG. 16 is an explanatory view of a vertical section showing the structure of a mounting section in the delivery section.

Now, the structure of the mounting section 270 will be explained in detail. As shown in FIG. 16, a thick disc-shaped mounting board 275 is provided while being supported by a supporting stand 276. A plurality of suction ports 277 as holding means for holding the mounting board 275 by sucking the wafer W are provided in the mounting board 275. A suction unit 278 for allowing the wafer W to be suction-held at a pressure at least lower than the pressure in the first route 260 communicates with the suction ports 277, which is structured to control its suction force according to the set pressure of the pressure reducing unit 267 and to be able to prevent the wafer W from being lifted off by its suction force even if the pressure in the first route 260 is reduced.

Temperature controllers 280 such as Peltier elements capable of controlling the temperature of the mounting board 275 are provided in the mounting board 275, and control the mounting board 275 at a predetermined temperature, whereby the temperature of the wafer W mounted on the mounting board 275 can be kept uniform within the surface of the wafer W. Provided under the mounting board 275 are raising and lowering pins 283 which are vertically movable in through-holes 282 provided in the mounting board 275, and they can raise and lower the wafer W to place the wafer W on the mounting board 275 and can deliver the wafer W between the wafer carrier 255 and the wafer carrier mechanism 271.

Meanwhile, as shown in FIG. 10, provided in the second route 261 are a mounting table 290 on which the wafer W which has undergone exposure processing is temporarily mounted when being transferred into the interface section 204 and a wafer carrier mechanism 291 as the fourth carrier unit for carrying the wafer W in the exposure processing unit 206 to the mounting table 290.

The mounting table 290 has a disc shape, and near the center thereof, raising and lowering mechanisms 293 for raising and lowing the mounted wafer W are provided. By means of these raising and lowering mechanisms 293, the wafer W can be delivered between the mounting table 290, and the wafer carrier mechanism 291 or the wafer carrier 255.

A transit opening 295 is provided at a position facing the mounting section 270 on the interface section 204 side of the casing 205a of the delivery section 205, and thereby the wafer W can be carried from the interface section 204 to the mounting section 270 by the wafer carrier 255. Moreover, a shutter 296 for opening and closing the transit opening 295 and maintaining the hermetic condition of the first route 260 is provided at the transit opening 295. The shutter 296 is opened only when the wafer W passes through the transit opening 295, and closed except that time.

A transit opening 297 is provided at a position facing the mounting table 290 on the interface section 204 side of the casing 205a, and thereby the wafer W can be carried from the mounting table 290 into the interface section 204 by the wafer carrier 255. A shutter 298 for opening and closing the transit opening 297 and maintaining the hermetic condition of the second route 261 is provided at the transit opening 297. The shutter 298 is opened only when the wafer W passes through the transit opening 297.

The exposure processing unit 206 for subjecting the wafer W to pattern exposure processing is provided adjacent to the delivery section 205 as shown in FIG. 10. This exposure processing unit 206 is hermetically sealed by a casing 206a, so that an atmosphere in the exposure processing unit 206 can be tightly controlled. A transit opening 300 through which the wafer W is carried in from the first route 260 and a transit opening 301 through which the wafer W is carried out to the second route 261 are provided at delivery section 205 side of the casing 206a, and shutters 302 and 303 for opening and closing the transit openings 300 and 301 respectively and maintaining the hermetic condition of the delivery section 205 are provided at the transit openings 300 and 301.

Next, a photolithography process performed in the coating and developing treatment system 201 structured as above will be explained.

Before starting the treatment of the wafer W, the pressures in the respective routes, that is, the first route 260 and the second route 261 of the delivery section 205 are controlled at a pressure P1 lower than a pressure P2 in the exposure processing unit 206 by the pressure reducing units 267 and 268. This control enables atmospheres in the respective routes not to flow into the exposure processing unit 206, and this condition is maintained thereafter.

When the treatment of the wafer W is started, first in the cassette station 202, one untreated wafer W is taken out of the cassette C by the wafer carrier 208 and carried into the adhesion unit 231 in the processing station 203.

The wafer W which is coated with an adhesion promoter such as HMDS which promotes adhesion with the resist solution in the adhesion unit 231 is then transferred to the cooling unit 230 by the main carrier unit 213 and cooled to a predetermined temperature. Thereafter, the wafer W is transferred to the resist coating unit 217 or 219 and subjected to resist coating treatment. The wafer W on which the resist film is formed is transferred to the heat and cooling treatment unit 246 or 247 (PRE/COL in FIG. 12) to be subjected to heat and cooling treatment for vaporizing the solvent in the resist solution. On this occasion, instead of performing heat treatment and cooling treatment sequentially in respective units provided separately, heat and cooling treatment is performed in a single unit such as the heat and cooling treatment unit 246 or 247, whereby the time required from the heat treatment to the cooling treatment of the wafer W can be kept always constant, and consequently a thermal budget given to the wafer W by heating can be made the same among the wafers W. Moreover, in this embodiment, all the heat and cooling treatment between the resist coating treatment and the developing treatment are performed by means of the heat and cooling treatment units 243 to 247, whereby the time required from the resist coating treatment to the developing treatment can be made the same for all the wafers W.

Thereafter, the wafer W is transferred to the extension unit 241, and then transferred from the extension unit 241 to the peripheral exposure unit 256 in the interface section 204 by the wafer carrier 255. The wafer W the peripheral portion of which is exposed in the peripheral exposure unit 256 is held again by the wafer carrier 255 and carried to the mounting section 270 in the first route 260 of the delivery section 205 through the transit opening 295. At this time, the shutter 296 is temporarily opened. After the wafer W is transferred to the mounting section 270, the shutter 296 is closed again, and the hermetic condition of the first route 260 is maintained.

The wafer W is then delivered to the raising and lowering pins 283 of the mounting section 270. As shown in FIG. 16, when the wafer W is mounted on the mounting board 275, the suction unit 278 is operated, and the wafer W is suction-held on the mounting board 275. The suction force of the suction unit 278 on this occasion is set so that the wafer W does not move even if the pressure in the first route 260 is reduced to a pressure P3 which will be described. Moreover, the mounting board 275 on this occasion is maintained at the predetermined temperature, for example, 23° C. by the temperature controller 280, and hence the uniformity of temperature within the surface of the wafer is maintained.

Subsequently, the set pressure of the pressure reducing unit 267 is changed to the pressure P3 which is lower than the pressure P1, and the atmosphere in the first route 260 starts to be sucked more strongly from the suction pipe 265. As shown in FIG. 15, an atmospheric current is formed in the first route 260, and the impurities adhering to the wafer W are expelled with the atmospheric current from the suction pipe 265. It is desirable that the set pressure P3 of the pressure reducing unit 267 on this occasion be, for example, 800 Pa or less in order to remove the impurities adhering onto the wafer W.

After the impurities on the wafer W are removed for a predetermined period of time, the set pressure of the pressure reducing unit 267 is changed again to P1. The gas supply unit 269 is operated, and the inert gas is supplied into the first route 260, and the pressure in the first route 260 is restored to P1.

Thereafter, the suction of the wafer W by the suction ports 277 is stopped, and the wafer W is raised by the raising and lowering pins 283 and delivered to the wafer carrier mechanism 271. When the shutter 302 of the casing 206a of the exposure processing unit 206 is opened, the wafer W is carried into the exposure processing unit 206.

A predetermined pattern is then exposed on the wafer W in the exposure processing unit 206. The wafer W which has undergone exposure is carried into the second route 261 from the exposure processing unit 206 through the transit opening 301 by the wafer carrier mechanism 291 in the second route 261. At this time, the shutter 303 is temporarily opened, and closed again after the wafer W passes through it, and thus the hermetic condition in the second route 261 is maintained.

The wafer W carried into the second route 261 is moved to a position above the mounting table 290, delivered to the raising and lowering mechanisms 293 of the mounting table 290, and temporarily placed on the mounting table 290.

The wafer W is carried from the mounting table 290 to the extension unit 242 in the processing station 203 through the transit opening 297 with the shutter 298 open and the interface section 204 by the wafer carrier 255.

The wafer W is then carried to the heat and cooling treatment unit 243, 244, or 245 by the main carrier unit 213 and subjected to heat and cooling treatment after exposure treatment in order.

Thereafter, the wafer W is transferred to the developing treatment unit 218 or 220 and subjected to developing treatment. The wafer W subjected to the developing treatment is transferred to the postbaking unit 235 or 236 and heated. The wafer W is then transferred to the cooling unit 233 or 234 and cooled to a predetermined temperature. The wafer W is then transferred to the extension unit 232 of the third treatment unit group, and returned therefrom to the cassette C in the cassette station 202 by the wafer carrier 208. The successive photolithography process is completed through the aforesaid steps.

According to the aforesaid third embodiment, the delivery section 205 which is hermetically closeable is provided between the interface section 204 and the exposure processing unit 206 and the pressure reducing unit 267 for reducing the pressure in the first route 260 of the delivery section 205 is provided. Thereby, the pressure in the first route 260 can be reduced when the wafer W passes through the first route 260 before undergoing exposure processing. As a result, the impurities such as oxygen adhering to the resist film on the wafer W can be removed.

Further, the delivery section 205 is divided into two routes of the first route 260 and the second route 261, whereby the process of transferring the wafer W from the interface section 204 to the exposure processing unit 206 and returning the wafer W from the exposure processing unit 206 to the interface section 204 again is performed smoothly.

Furthermore, since the pressure reducing units 267 and 268 are provided respectively in the first route 260 and the second route 261, the pressures in both the routes can be set at different pressures, that is, the pressure in the first route 260 is set at the pressure P3 at which the impurities on the wafer W are removed, while the pressure in the second route 261 is set at the pressure P1 at which the atmosphere in the second route 261 does not flow into the exposure processing unit 206.

The pressure P1 in the delivery section 205 is always set lower than the pressure P2 in the exposure processing unit 206, which can prevent the atmosphere in the delivery section 205 from flowing into the exposure processing unit 206 in which the atmosphere is tightly controlled.

Since the mounting section 270 is provided in the first route 260, and the suction ports 277 are provided in the mounting section 270, the wafer W can be mounted and fixed when the impurities are removed from the wafer W. Hence, when the pressure in the first route 260 is reduced, the wafer W can be prevented from being lifted off by its negative pressure.

The wafer carrier mechanism 271 capable of carrying the wafer W to the mounting section 270 and the exposure processing unit 206 is provided in the first route 260. Consequently, when the impurities on the wafer W are removed, impurities adhering to the wafer carrier mechanism 271 are also removed, whereby the wafer carrier mechanism 271 can be maintained in a clean condition, resulting in the prevention of the contamination of the wafer W due to the impurities adhering to the wafer carrier mechanism 271.

In the aforesaid third embodiment, the suction ports 277 are provided as the holding means of the wafer W in the mounting section 270, but another holding means, for example, an electrostatic chuck, a so-called mechanical chuck, or the like may be used in the mounting section 270. As for the position at which the holding means is provided, the holding means may be provided at a position other than the mounting section 270 in the first route 260, for example, may be provided in the wafer carrier mechanism 271. In this case, it is recommended that the aforesaid treatment for removing the impurities be performed when the wafer W is held by the holding means.

Figure 17:
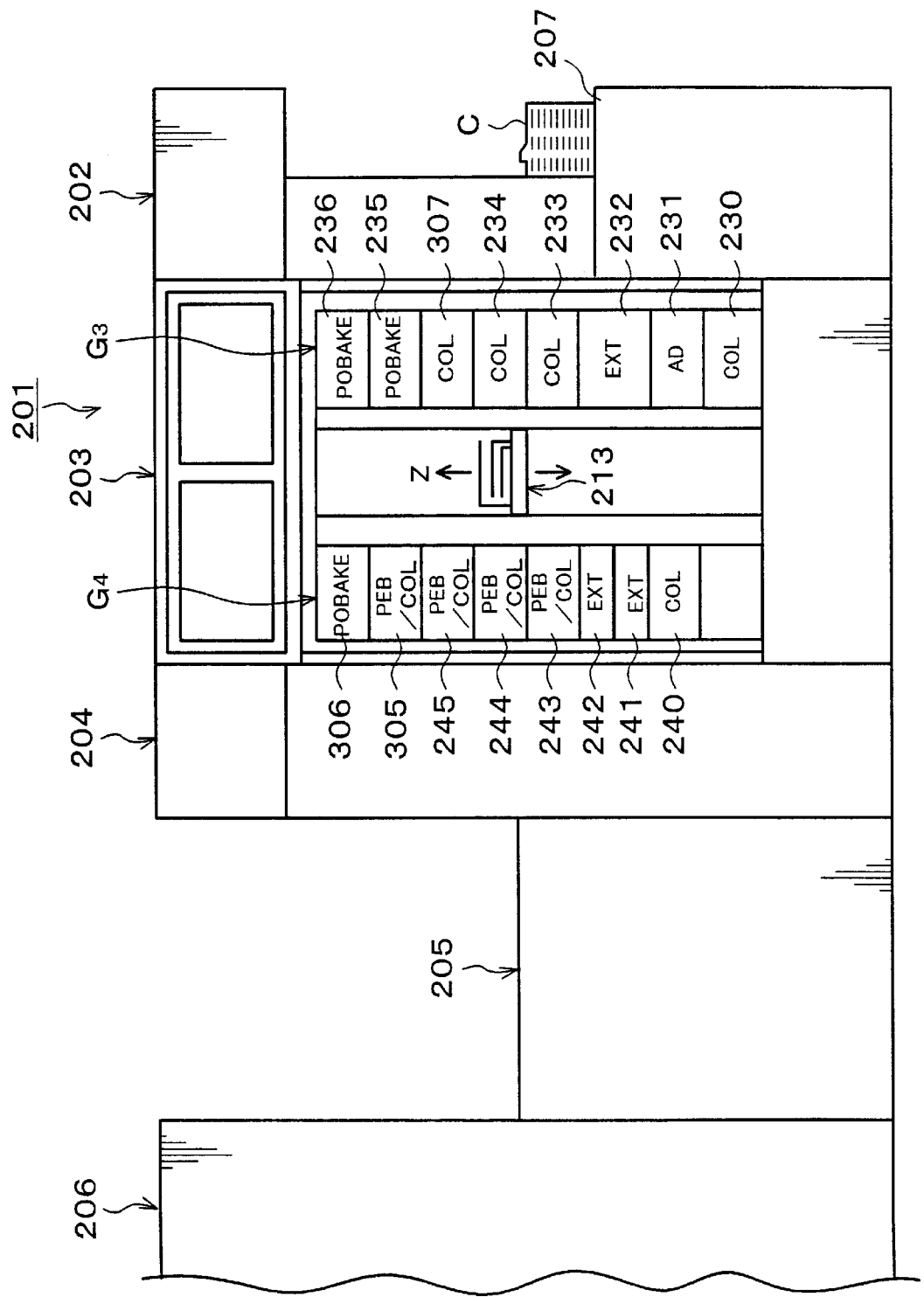
FIG. 17 is an explanatory view showing an example of arrangement of heat and cooling treatment units in the coating and developing treatment system when the treatment for vaporizing the solvent in the resist solution is performed in the delivery section.

Moreover, it is suitable to perform the treatment for vaporizing the solvent in the resist solution, which is performed in the heat and cooling treatment unit 246 or 247, in the first route 260 of the delivery section 205, in which case, as shown in FIG. 17, a heat and cooling treatment unit 305 (PEB/COL) for performing heat and cooling treatment after exposure and a heat treatment unit 306 for performing heat treatment after developing treatment are provided instead of the heat and cooling treatment units 246 and 247 (PRE/COL) in the fourth treatment unit group G4 in the processing station 203 and a cooling treatment unit 307 for performing cooling treatment after heat treatment after exposure is added to the third treatment unit group G3. When the wafer W is mounted in the mounting section 270 in the first route 260, the pressure in the first route 260 is reduced to a predetermined pressure, for example, 133 Pa at which the solvent in the resist solution is vaporized to vaporize the solvent in the resist solution, at which time the aforesaid treatment of removing the impurities is performed. Thus, both the treatment for vaporizing the solvent and the treatment for removing the impurities can be performed simultaneously by only reducing the pressure in the delivery section 205 to the predetermined pressure. Accordingly, the treatment hitherto performed in the heat and cooling treatment unit 246 or 247 can be performed in the first route 260 in the delivery section 205. As a result, other thermal treatment units can be added instead of the units used for the treatment for vaporizing the solvent, whereby processing capability in the processing station 203 is improved. Even if the heat and cooling treatment units 246 and 247 are omitted without adding other thermal treatment units, the number of thermal treatment units can be reduced, resulting in the downsizing of the whole processing station 203.

In the aforesaid third embodiment, the impurities are removed by reducing the pressure in the whole first route 260 to P3. It is suitable, however, to provide a most reduced-pressure chamber in the first route 260, reduce the pressure in the most reduced-pressure chamber to P3, and set the pressure in the whole first route 260 at a pressure, for example, P4 higher than P3. Such a case will be explained below as a fourth embodiment.

Figure 18:
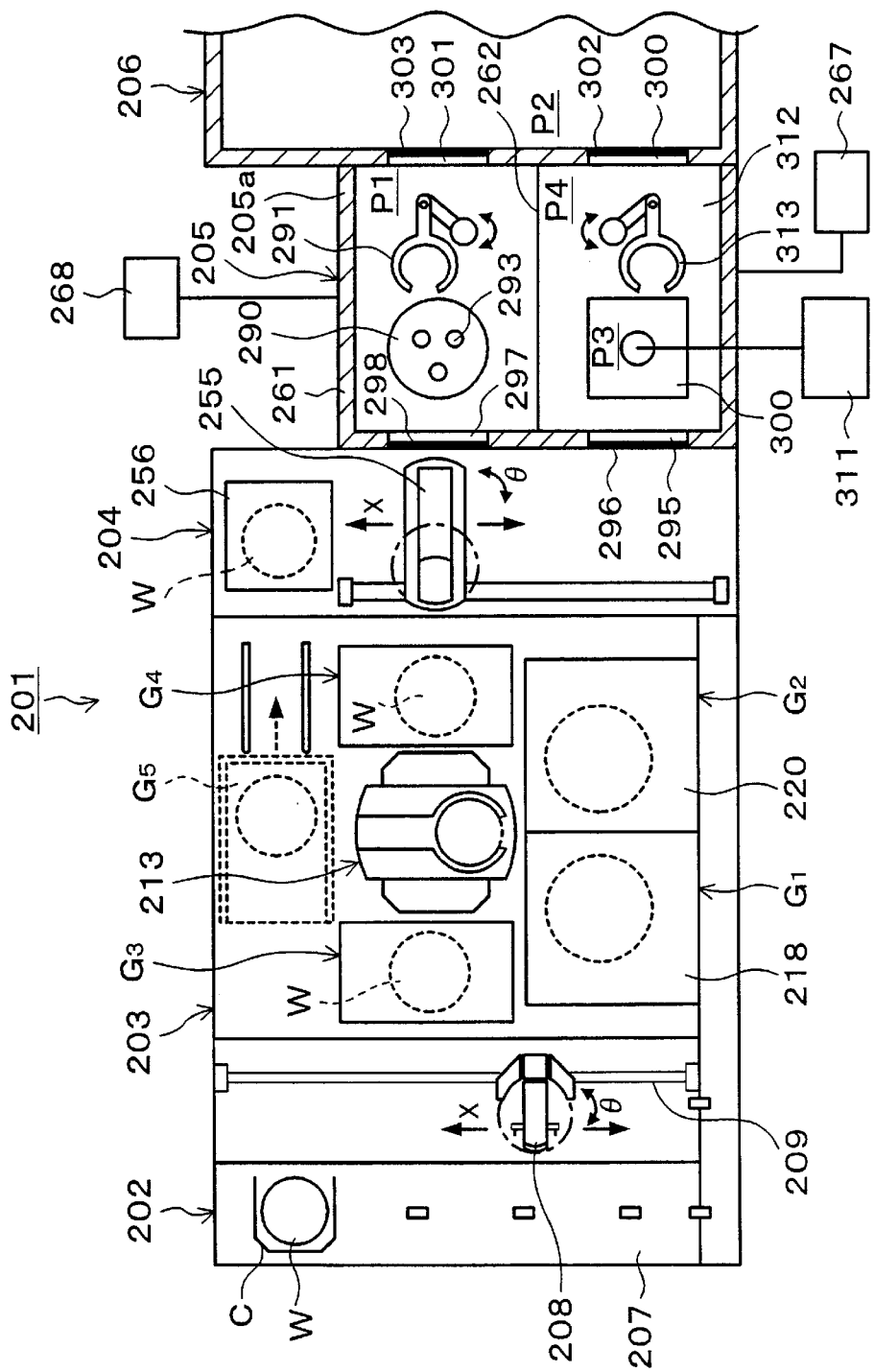
FIG. 18 is an explanatory plan view of a coating and developing treatment system according to a fourth embodiment.
Figure 19:
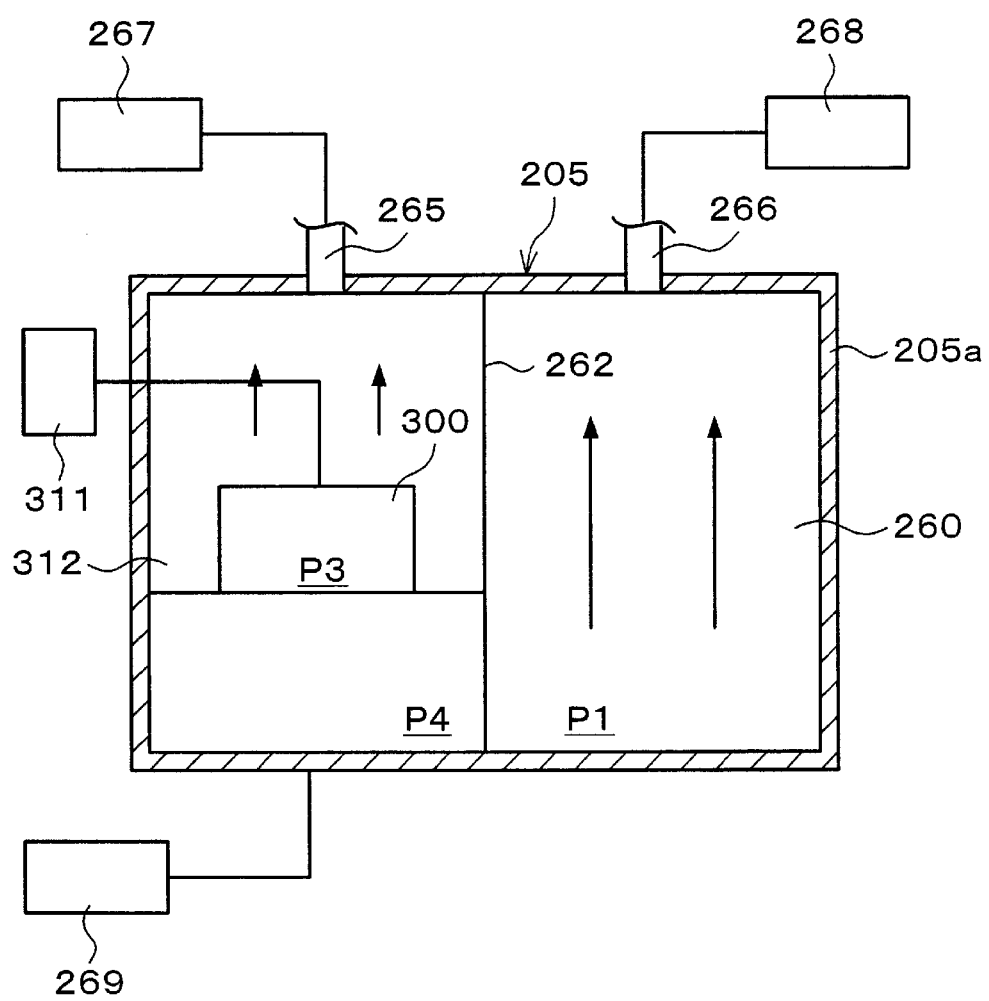
FIG. 19 is an explanatory view of a vertical section showing the interior of the delivery section of the coating and developing treatment system in FIG. 18 as seen from the exposure processing unit.

As shown in FIG. 18 and FIG. 19, for example, a most reduced-pressure chamber 310 which is structured to be hermetically closeable is provided in place of the mounting section 270 described in the aforesaid embodiment in a first route 312 in the fourth embodiment. A pressure reducing unit 311 for reducing the pressure in the most reduced-pressure chamber 310 is provided in the most reduced-pressure chamber 310, and the pressure can be reduced by sucking an atmosphere in the most reduced-pressure chamber 310 from the upper portion of the most reduced-pressure chamber 3110. A wafer carrier mechanism 313 as the third carrier unit which can get access to the most reduced-pressure chamber 310 and the exposure processing unit 206 to carry the wafer W is provided in the first route 312. The wafer carrier 255 in the interface section 204 can carry the wafer W to the most reduced-pressure chamber 310.

When the wafer W is carried to the most reduced-pressure chamber 310 in the first route 312 thus structured, the pressure reducing unit 311 is operated, and the pressure in the most reduced-pressure chamber 310 is reduced to P3. At this time, the pressure in the first route 312 is reduced from P1 to P4 which is higher than P3 (P3<P4<P1<P2, P2 is the pressure in the exposure processing unit 6). Impurities are removed from the wafer W in the most reduced-pressure chamber 310, and the wafer W is then carried out of the most reduced-pressure chamber 310 and carried into the exposure processing unit 206 which is set at the pressure P2 through the first route 312 which is set at the pressure P4.

By providing the most reduced-pressure chamber 310 and setting the pressure in the first route 312 at P4 (P3<P4<P2) while the wafer W is carried from the most reduced-pressure chamber 310 into the exposure processing unit 206, the pressure is restored stepwise from P3 to P2, which prevents an atmosphere in the exposure processing unit 206 from flowing into the first route 312 with great force when the wafer W is carried into the exposure processing unit 206. Moreover, the treatment for vaporizing the solvent in the resist solution which is performed in the heat and cooling treatment unit 246 or 247 can be performed in this most reduced-pressure chamber 310.

Although the embodiments explained above relate to the coating and developing treatment system for the wafer W in the photolithography of the semiconductor wafer device fabrication process, the present invention can be applied to a coating and developing treatment system for substrates other than a semiconductor wafer, for example, an LCD substrate.

According to the present invention, before exposure processing, impurities at molecular level such as oxygen, ozone, and organic substances and impurities such as particulates which adhere to a coating film of a substrate can be removed, whereby exposure processing is suitably performed without being influenced by the impurities, resulting in a rise in yield. Besides, simultaneously with the treatment for removing the impurities, a solvent in the coating solution can be vaporized, leading to a rise in throughput.

Especially when the pressure reducing and removing unit is provided in the delivery section, the impurities can be removed from the substrate at a position closer to the exposure processing unit, and hence the substrate can be subjected to exposure processing in a cleaner condition. Moreover, enough space to provide a complicated mechanism such as the pressure reducing and removing unit can be secured, whereby the system can be simplified.

Furthermore, by providing two routes in the delivery section, the substrate can be treated smoothly, resulting in a rise in throughput.

Especially, by providing the most reduced-pressure chamber capable of removing the impurities more strongly in the first route of the delivery section, the pressure can be restored stepwise when the substrate is transferred from the most reduced-pressure chamber into the exposure processing unit through the first route, which suppresses the occurrence of a strong atmospheric current due to a difference in pressure and hence suppresses variations in atmospheres in the exposure processing unit and the first route. As a result, the time required to obtain predetermined atmospheres in the exposure processing unit and the first route is shortened, thereby raising throughput.

What is claimed is:

1. A coating and developing treatment system for performing coating and developing treatment for a substrate, comprising:

a treatment section having a coating treatment unit for forming a coating film of the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit;

an interface section having a second carrier unit for carrying the substrate through a route at least between the treatment section and an exposure processing unit provided outside the system for performing exposure processing for the substrate; and a pressure reducing and removing unit for removing impurities adhering to the coating film on the substrate by suction in a chamber before the substrate is subjected to the exposure processing;

wherein the interface section and the exposure processing unit are connected by a delivery section, and wherein the pressure reducing and removing unit is provided in the delivery section.

2. A system as set forth in claim 1, further comprising:

a gas supply unit for supplying an inert gas into the delivery section; and an exhaust means for exhausting an atmosphere the delivery section.

3. A system as set forth in claim 2, further comprising:

a partition plate for partitioning off an atmosphere in the interface section from the atmosphere in the delivery section, the partition plate comprising;

a transit opening for delivering the substrate between the interface section and the delivery section, and a shutter for opening and closing the transit opening.

4. A system as set forth in claim 1,
wherein a pressure in the delivery section is lower than a pressure in the exposure processing unit.

5. A system as set forth in claim 1,
wherein the delivery section has a first route through which the substrate passes when being carried from the interface section to the exposure processing unit and a second route through which the substrate passes when being carried from the exposure processing unit to the interface section, and
wherein the pressure reducing and removing unit is provided in the first route.

6. A system as set forth in claim 5,
wherein the second carrier unit is allowed to carry the substrate at least to the pressure reducing and removing unit, and
wherein a third carrier unit for carrying the substrate at least from the pressure reducing and removing device to the exposure processing unit is provided in the first route of the delivery section.

7. A system as set forth in claim 6,
wherein a mounting table for mounting the substrate and a fourth carrier unit for carrying the substrate at least from the exposure processing unit to the mounting table are provided in the second route of the delivery section, and
wherein the second carrier unit is allowed to carry the substrate at least out of the mounting table.

8. A coating and developing treatment system for performing coating and developing treatment for a substrate, comprising:
   a treatment section having a coating treatment unit for forming a coating film on the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit;
   an interface section having a second carrier unit for carrying the substrate through a route at least between the treatment section and an exposure processing unit provided outside the system for performing exposure processing for the substrate;
   a pressure reducing and removing unit for removing impurities adhering to the coating film on the substrate by suction in a chamber before the substrate is subjected to the exposure processing;
   a gas supply unit for supplying an inert gas into the interface section;
   an exhaust means for exhausting an atmosphere in the interface section; and
   a partition plate for partitioning off an atmosphere in the treatment section from the atmosphere in the interface section,
   the partition plate comprising;
      a transit opening for delivering the substrate between the treatment section and the interface section, and
      a shutter for opening and closing the transit opening;
   wherein the pressure reducing and removing unit is provided in the interface section.

9. A coating and developing treatment system for performing coating and developing treatment for a substrate, comprising:
   a treatment section having a coating treatment unit for forming a coating film on the substrate, a developing treatment unit for developing the substrate, a thermal treatment unit for performing thermal treatment for the substrate, and a first carrier unit for carrying the substrate into/out of these coating treatment unit, developing treatment unit, and thermal treatment unit;
   an interface section having a second carrier unit for carrying the substrate through a route at least between the treatment section and an exposure processing unit provided outside the system for performing exposure processing for the substrate;
   a delivery section which is connected between the interface section and the exposure processing unit and hermetically closeable; and
   a pressure reducing unit for reducing a pressure in the delivery section to a predetermined set pressure;
   wherein the predetermine set pressure is (i) 800 Pa or lower and (ii) a pressure lower than that in the exposure processing unit.

10. A system as set forth in claim 9,
wherein the delivery section has a first route through which the substrate passes when being carried from the interface section to the exposure processing unit and a second route through which the substrate passes when being carried from the exposure processing unit to the interface section, and
wherein pressures in the first route and the second route are allowed to be reduced to predetermined set pressures respectively.

11. A system as set forth in claim 10,
wherein the pressure in the first route is lower than a pressure in the exposure processing unit.

12. A system as set forth in claim 10,
wherein the pressure in the second route is lower than a pressure in the exposure processing unit.

13. A system as set forth in claim 10,
wherein a mounting section for mounting the substrate and a third carrier unit for carrying the substrate at least from the mounting section to the exposure processing unit are provided in the first route of the delivery section, and
wherein the second carrier unit is allowed to carry the substrate at least to the mounting section.

14. A system as set forth in claim 13,
wherein a holding means for holding the substrate in the mounting section is provided in the mounting section.

15. A system as set forth in claim 10,
wherein a most reduced-pressure chamber capable of being controlled at a pressure lower than the pressure in the first route is provided in the first route.

16. A system as set forth in claim 15,
wherein the second carrier unit is allowed to carry the substrate at least to the most reduced-pressure chamber, and
wherein a third carrier unit for carrying the substrate at least from the most reduced-pressure chamber to the exposure processing unit is provided in the first route of the delivery section.

17. A system as set forth in claim 13,
wherein a mounting table for mounting the substrate and a fourth carrier unit for carrying the substrate at least from the exposure processing unit to the mounting table are provided in the second route of the delivery section, and
wherein the second carrier unit is allowed to carry the substrate at least out of the mounting table.

* * * * *